(12) United States Patent
Hashimoto et al.

(10) Patent No.: US 11,956,886 B2
(45) Date of Patent: Apr. 9, 2024

(54) CONNECTOR AND METHOD FOR MANUFACTURING SAME

(71) Applicant: I-PEX Inc., Kyoto (JP)

(72) Inventors: Yoichi Hashimoto, Tokyo (JP); Sho Suzuki, Tokyo (JP); Shogo Matsuo, Tokyo (JP)

(73) Assignee: I-PEX Inc., Kyoto (JP)

(*) Notice: Subject to any disclaimer, the term of this patent is extended or adjusted under 35 U.S.C. 154(b) by 215 days.

(21) Appl. No.: 17/598,639

(22) PCT Filed: Apr. 3, 2020

(86) PCT No.: PCT/JP2020/015421
§ 371 (c)(1),
(2) Date: Sep. 27, 2021

(87) PCT Pub. No.: WO2020/204190
PCT Pub. Date: Oct. 8, 2020

(65) Prior Publication Data
US 2022/0167493 A1 May 26, 2022

(30) Foreign Application Priority Data
Apr. 3, 2019 (JP) .................................. 2019-071593

(51) Int. Cl.
*H04B 10/00* (2013.01)
*G02B 6/42* (2006.01)
(Continued)

(52) U.S. Cl.
CPC ......... *H05K 1/0209* (2013.01); *G02B 6/4268* (2013.01); *G02B 6/428* (2013.01); *H01R 13/6581* (2013.01)

(58) Field of Classification Search
CPC ...... H05K 1/0209; H05K 1/117; H05K 1/181; H05K 2201/10121; G02B 6/4268;
(Continued)

(56) References Cited

U.S. PATENT DOCUMENTS 5,768,110 A * 6/1998 Frommer ............. H05K 5/0269
361/755
5,836,774 A * 11/1998 Tan ..................... H01R 13/6275
439/906
(Continued)

FOREIGN PATENT DOCUMENTS

CN 103105649 A 5/2013
JP 2002-198110 A 7/2002
(Continued)

OTHER PUBLICATIONS

International Search Report Written Opinion for International Patent Application No. PCT/JP2020/015421 dated Jun. 9, 2020; 3 pages.
(Continued)

*Primary Examiner* — Agustin Bello
(74) *Attorney, Agent, or Firm* — Howard & Howard Attorneys PLLC

(57) ABSTRACT

A connector includes: a circuit board; a first heat transfer material arranged on a principal surface of the circuit board; a first shell having an end mated with a mating connector in a state in which the terminal end portion of the circuit board protrudes from the end, and includes an opposite opposed to at least a part of a target region which is a region other than the terminal end portion, covers at least a part of the target region, and is conductive; a second shell connected to an end of the first shell, covers at least a part of the target region of the principal surface, and is thermally conductably connected to the circuit board in contact with the first heat transfer material; and a third shell engaged with the second
(Continued)

shell, covers at least a part of the target region of a principal surface, and is conductive.

21 Claims, 22 Drawing Sheets

(51) Int. Cl.
*H01R 13/6581* (2011.01)
*H05K 1/02* (2006.01)

(58) Field of Classification Search
CPC ............... G02B 6/428; H01R 13/6581; H01R 13/6594; H01R 12/72
See application file for complete search history.

(56) References Cited

U.S. PATENT DOCUMENTS

| | | | | |
|---|---|---|---|---|
| 6,059,602 A * | 5/2000 | Ward | ................ | H01R 13/6581 439/465 |
| 6,165,006 A * | 12/2000 | Yeh | ................ | H01R 13/7172 439/490 |
| 6,179,627 B1 * | 1/2001 | Daly | ................ | H01R 13/6658 439/354 |
| 6,210,229 B1 * | 4/2001 | Lai | ................ | H01R 13/6591 439/607.52 |
| 6,220,878 B1 * | 4/2001 | Poplawski | ................ | C07D 491/22 439/92 |
| 6,296,514 B1 * | 10/2001 | Medina | ................ | H01R 13/6592 439/404 |
| 6,328,588 B1 * | 12/2001 | Tsai | ................ | H01R 13/6594 439/352 |
| 6,386,919 B2 * | 5/2002 | Medina | ................ | H01R 13/6592 439/607.46 |
| 6,394,817 B1 * | 5/2002 | Kihira | ................ | H01R 13/701 439/63 |
| 6,447,303 B1 * | 9/2002 | Kihira | ................ | H01R 12/716 439/63 |
| 6,692,159 B2 * | 2/2004 | Chiu | ................ | G02B 6/4261 385/53 |
| 6,736,667 B1 * | 5/2004 | Wu | ................ | H01R 13/6335 439/484 |
| 6,799,986 B2 * | 10/2004 | Igarashi | ................ | H01R 13/6275 439/358 |
| 6,887,091 B1 * | 5/2005 | Wu | ................ | H01R 13/6335 439/352 |
| 6,913,482 B1 * | 7/2005 | Wu | ................ | H01R 25/003 439/502 |
| 7,114,980 B1 * | 10/2006 | Wu | ................ | H01R 13/6335 439/352 |
| 7,144,788 B2 * | 12/2006 | Kihara | ................ | G02B 6/4279 257/E21.44 |
| 7,160,036 B2 * | 1/2007 | Keeble | ................ | G02B 6/428 385/88 |
| 7,163,408 B1 * | 1/2007 | Chen | ................ | H01R 13/5845 439/76.1 |
| 7,210,943 B1 * | 5/2007 | Chang | ................ | H01R 13/6658 439/76.1 |
| 7,246,954 B2 * | 7/2007 | Vancoille | ................ | G02B 6/4256 385/94 |
| 7,297,010 B2 * | 11/2007 | Tsai | ................ | H01R 13/2442 439/862 |
| 7,297,028 B2 * | 11/2007 | Daikuhara | ................ | G02B 6/4246 439/577 |
| 7,317,742 B2 * | 1/2008 | Saito | ................ | G02B 6/4292 372/50.1 |
| 7,486,524 B2 * | 2/2009 | Ice | ................ | H05K 9/0058 361/752 |
| 7,572,145 B1 * | 8/2009 | Wu | ................ | H01R 13/6588 439/607.02 |
| 7,618,264 B2 * | 11/2009 | Wu | ................ | H01R 13/6658 439/76.1 |
| 7,651,341 B2 * | 1/2010 | Wu | ................ | H01R 13/6335 439/76.1 |
| 7,651,342 B1 * | 1/2010 | Wu | ................ | H01R 13/6471 439/607.46 |
| 7,654,831 B1 * | 2/2010 | Wu | ................ | H01R 12/62 439/607.46 |
| 7,901,238 B1 * | 3/2011 | Muir | ................ | H01R 13/6658 439/417 |
| 7,922,520 B2 * | 4/2011 | Mizukami | ................ | H01R 13/65912 439/493 |
| 7,997,909 B2 * | 8/2011 | Xu | ................ | H01R 13/6658 439/607.57 |
| 8,011,950 B2 * | 9/2011 | McGrath | ................ | H01R 13/6594 439/497 |
| 8,052,430 B2 * | 11/2011 | Wu | ................ | H01R 13/65912 439/76.1 |
| 8,083,417 B2 * | 12/2011 | Aronson | ................ | G02B 6/3817 385/88 |
| 8,123,541 B2 * | 2/2012 | Hsu | ................ | H01R 12/716 439/325 |
| 8,235,731 B1 * | 8/2012 | Poulsen | ................ | H01R 13/6466 439/76.1 |
| 8,545,250 B2 * | 10/2013 | Ju | ................ | H01R 12/85 439/342 |
| 8,851,905 B2 * | 10/2014 | Soubh | ................ | H01R 43/205 439/76.1 |
| 9,350,125 B2 * | 5/2016 | Jones | ................ | H01R 24/60 |
| 10,096,936 B2 * | 10/2018 | Ju | ................ | H01R 13/405 |
| 10,236,609 B2 * | 3/2019 | Tziviskos | ................ | H01R 12/79 |
| 10,436,992 B2 * | 10/2019 | Zbinden | ................ | G02B 6/4292 |
| 10,581,220 B2 * | 3/2020 | Hatano | ................ | H01S 5/0087 |
| 10,622,738 B2 * | 4/2020 | Nakamura | ................ | H01R 12/72 |
| 10,622,767 B2 * | 4/2020 | Wu | ................ | H01R 13/6658 |
| 10,957,997 B2 * | 3/2021 | Qiao | ................ | H01R 12/50 |
| 10,965,333 B2 * | 3/2021 | English | ................ | H01R 13/2457 |
| 11,201,131 B2 * | 12/2021 | Hatano | ................ | H01S 5/0425 |
| 11,228,123 B2 * | 1/2022 | Ayzenberg | ................ | H05K 1/117 |
| 11,264,744 B2 * | 3/2022 | Nakamura | ................ | H05K 5/0286 |
| 11,444,405 B2 * | 9/2022 | Nakamura | ................ | H01R 12/88 |
| 2003/0128552 A1 * | 7/2003 | Takagi | ................ | G02B 6/4221 362/555 |
| 2005/0089280 A1 * | 4/2005 | Kumar | ................ | H01S 5/02212 257/E23.19 |
| 2005/0264924 A1 * | 12/2005 | Kimura | ................ | G11B 5/012 |
| 2006/0030172 A1 * | 2/2006 | Wu | ................ | H01R 13/6658 439/76.1 |
| 2006/0244741 A1 * | 11/2006 | Kimura | ................ | G02F 1/133514 345/204 |
| 2007/0014064 A1 | 1/2007 | Souma | | |
| 2007/0105410 A1 * | 5/2007 | Wu | ................ | H01R 13/6275 439/76.1 |
| 2007/0140643 A1 | 6/2007 | Daikuhara et al. | | |
| 2009/0197438 A1 * | 8/2009 | Liu | ................ | H01R 13/506 439/76.1 |
| 2009/0301761 A1 * | 12/2009 | Wu | ................ | H05K 1/117 174/250 |
| 2010/0087098 A1 * | 4/2010 | Sloey | ................ | H01R 13/4538 439/660 |
| 2010/0210142 A1 * | 8/2010 | McGrath | ................ | H01R 13/6474 439/620.22 |
| 2011/0076883 A1 * | 3/2011 | Jol | ................ | H01R 43/24 29/877 |
| 2011/0101409 A1 * | 5/2011 | Barnett | ................ | H01L 24/97 257/E23.001 |
| 2012/0064779 A1 * | 3/2012 | Wu | ................ | H01R 13/6589 439/676 |
| 2013/0009481 A1 | 1/2013 | Ballantine et al. | | |
| 2013/0094818 A1 | 4/2013 | Arao | | |
| 2013/0128489 A1 * | 5/2013 | Satake | ................ | H01L 23/057 361/820 |
| 2014/0024236 A1 * | 1/2014 | Little | ................ | H01R 13/6581 439/159 |
| 2014/0349514 A1 * | 11/2014 | Yang | ................ | H01R 12/721 439/487 |
| 2017/0110837 A1 * | 4/2017 | Taniguchi | ................ | H01R 24/62 |

(56) References Cited

U.S. PATENT DOCUMENTS

| | | | |
|---|---|---|---|
| 2017/0358895 A1* | 12/2017 | Chung | H01R 13/6272 |
| 2019/0190213 A1* | 6/2019 | Wu | H01R 13/6593 |
| 2022/0167493 A1* | 5/2022 | Hashimoto | G02B 6/4268 |

FOREIGN PATENT DOCUMENTS

| | | | |
|---|---|---|---|
| JP | 2007-157393 A | 6/2007 | |
| JP | 4613484 B2 | 1/2011 | |
| JP | 2013-083946 A | 5/2013 | |
| JP | 2016-197549 A | 11/2016 | |
| TW | 268101 B | 1/1996 | |

OTHER PUBLICATIONS

Written Opinion for International Patent Application No. PCT/JP2020/015421 dated Jun. 9, 2020; 5 pages.

Machine-assisted English language translation of Japanese Patent No. 4 613 484 B2 extracted from www.espacenet.com on Sep. 27, 2021; 11 pages.

English language abstract of Japanese Patent Publication No. JP 2002-198110 A extracted from www.espacenet.com on Sep. 27, 2021, see English language equivalent U.S. Pat. No. 6,394,817 B1; 1 pages.

English language abstract of Japanese Patent Publication No. JP 2007-157393 A extracted from www.espacenet.com on Sep. 27, 2021, see English language equivalent U.S. Pat. No. 7,297,028 B2; 1 pages.

Machine-assisted English language translation of Japanese Patent Publication No. JP 2013-083946 A extracted from www.espacenet.com on Sep. 27, 2021; 18 pages.

Machine-assisted English language translation of Japanese Patent Publication No. JP 2016-197549 A extracted from www.espacenet.com on Sep. 27, 2021; 16 pages.

Taiwan Office Action dated Aug. 14, 2023, issued for the corresponding TW Patent Application No. 109111520 and the English translation, 10 pages.

* cited by examiner

FIG. 14A
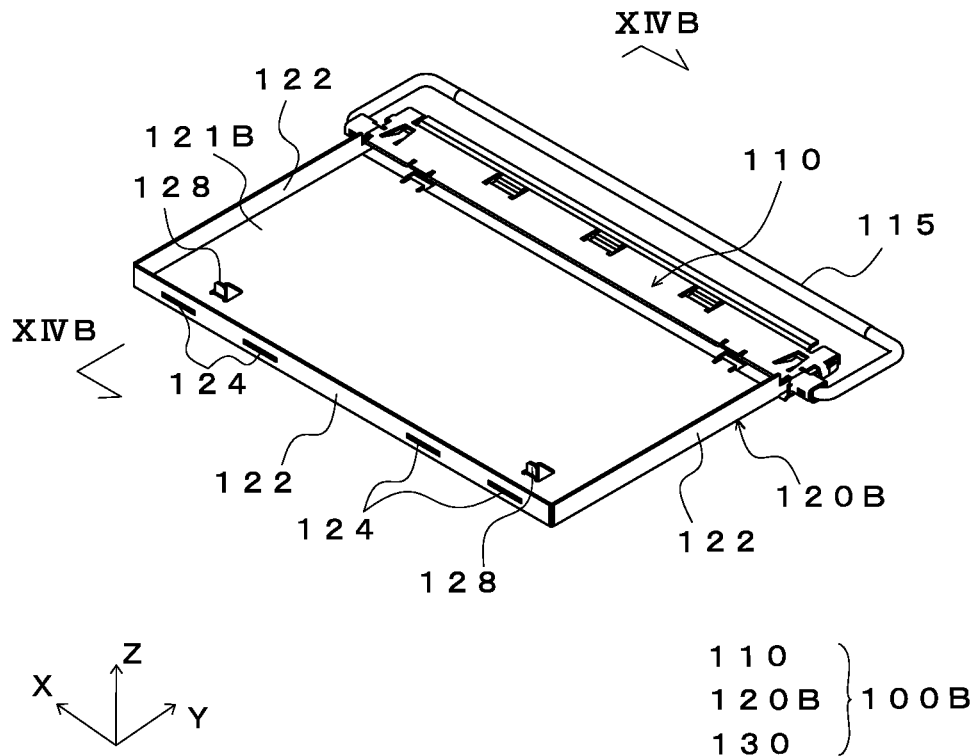
FIG. 14B
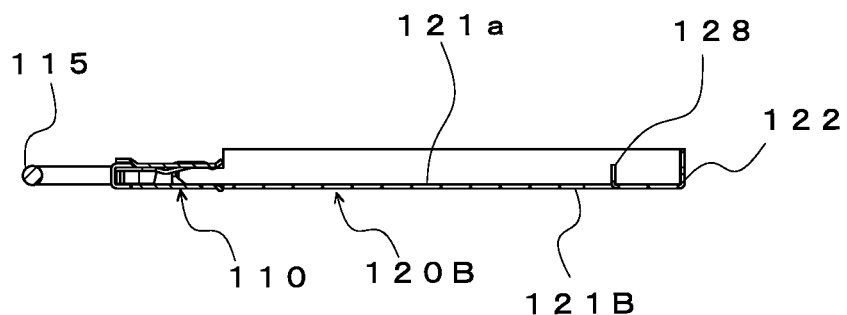
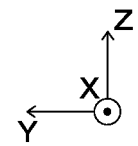

FIG. 15A
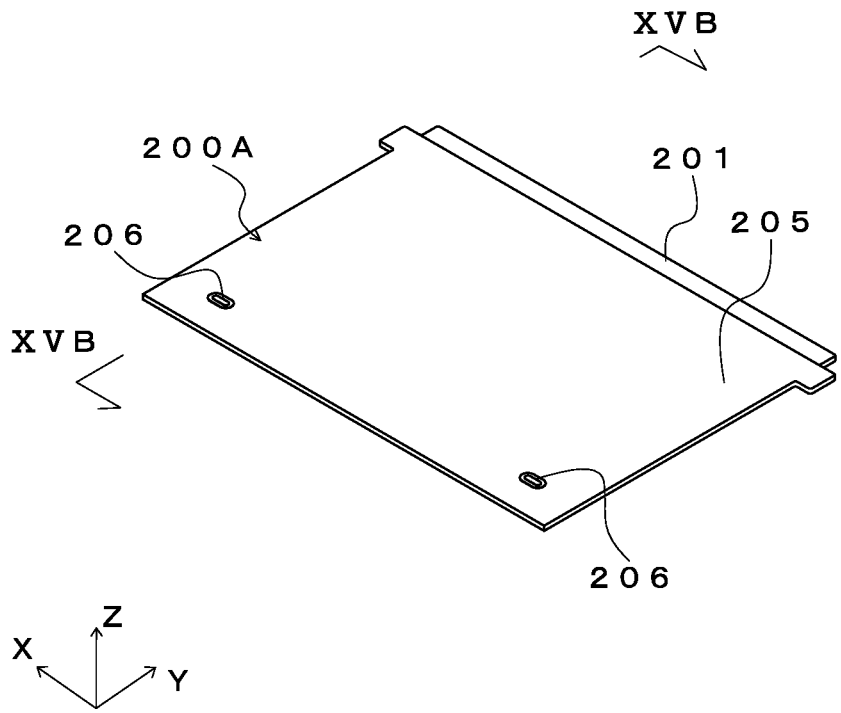
FIG. 15B
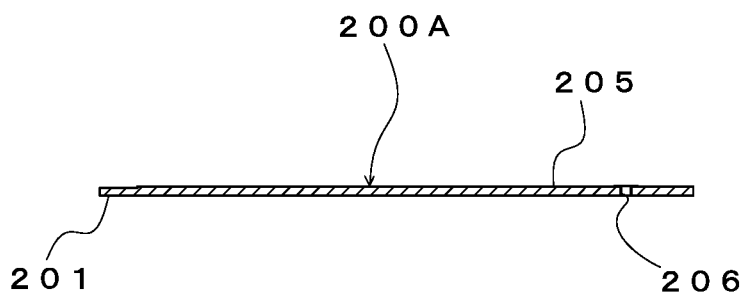
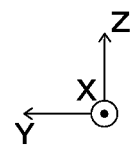

FIG. 16A
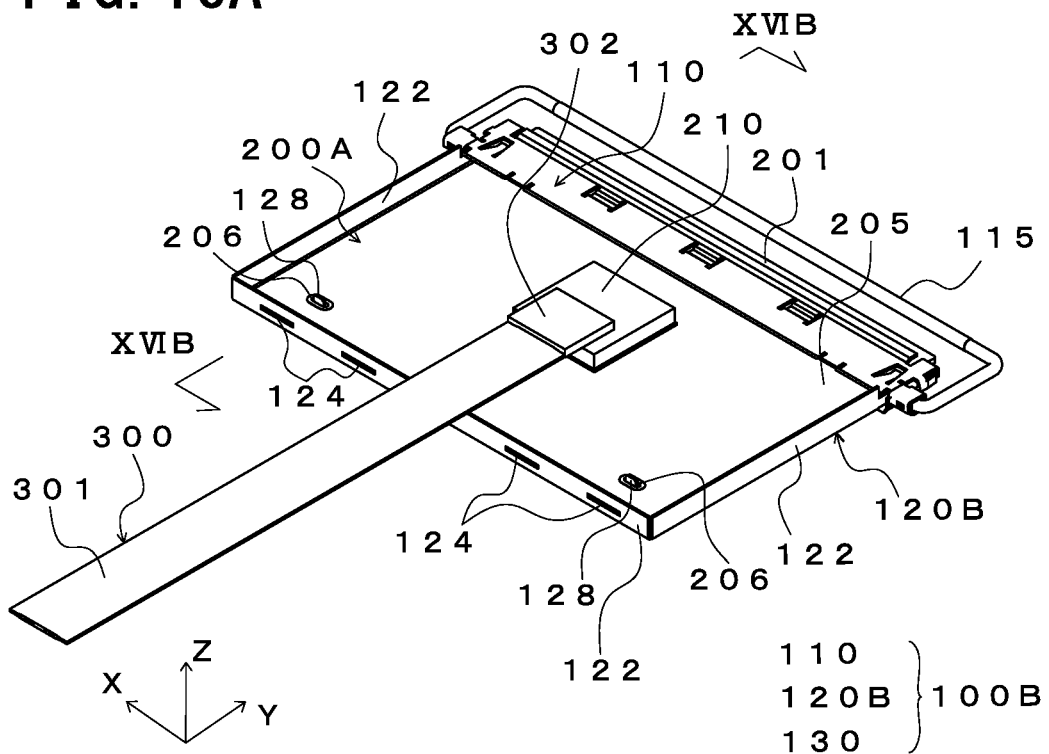
FIG. 16B
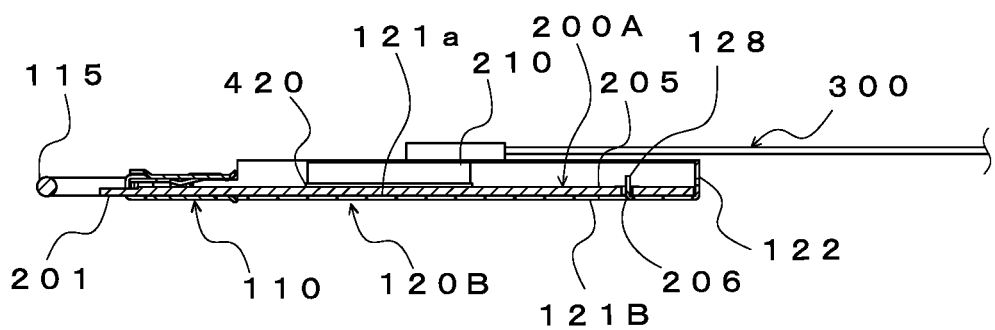
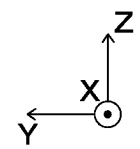

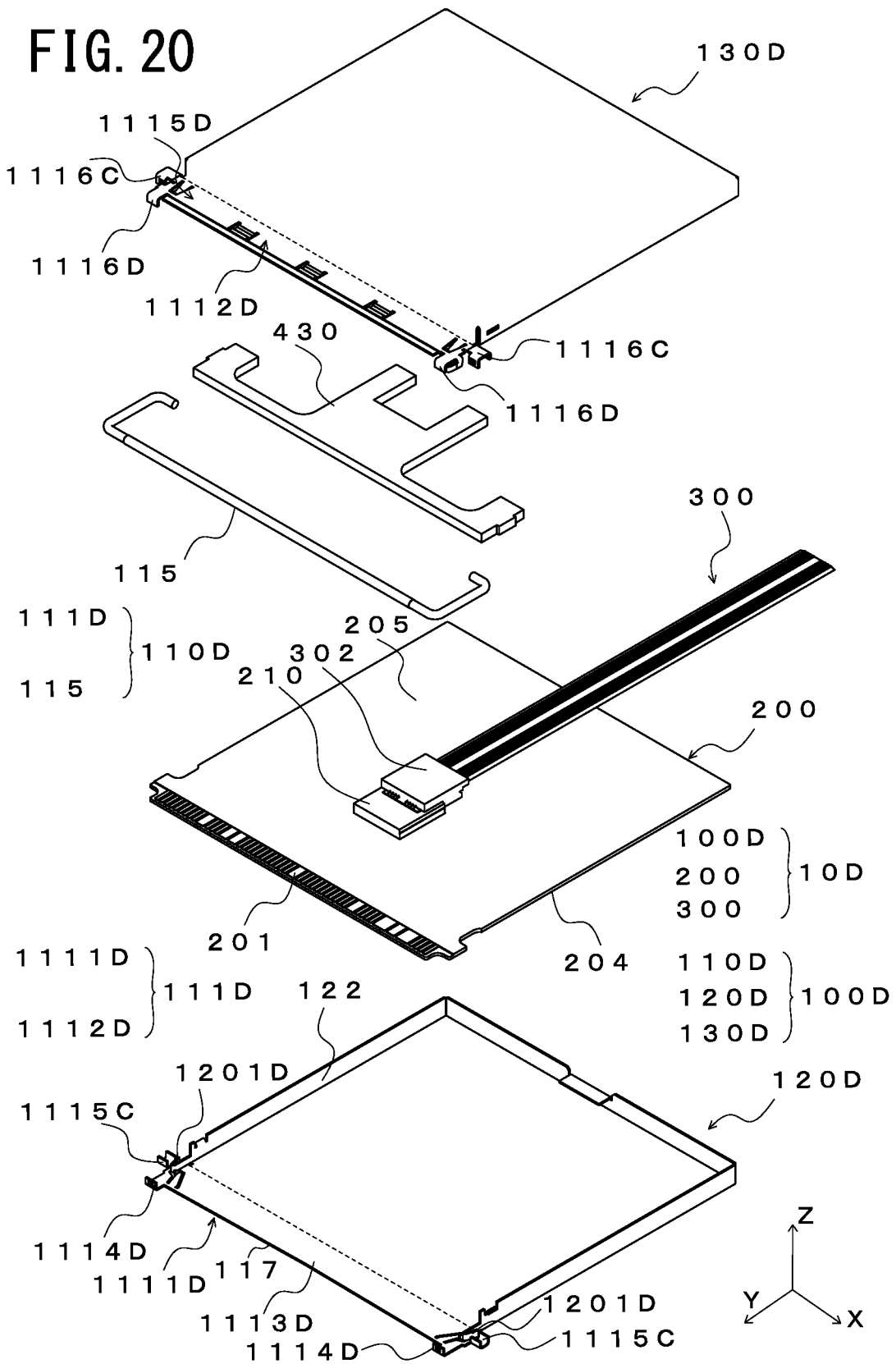

CONNECTOR AND METHOD FOR MANUFACTURING SAME

CROSS-REFERENCE TO RELATED APPLICATIONS

This application is the National Stage entry of International Patent Application No. PCI7JP2020/015421, filed Apr. 3, 2020, which claims priority to and all the advantages of Japanese Patent Application No. JP 2019-071593, filed Apr. 3, 2019, the entire contents of which are hereby incorporated by reference.

TECHNICAL FIELD

The present disclosure relates to a connector and a method of manufacturing the connector.

BACKGROUND ART

A speedup in communication through servers and the like has resulted in upsizing of connectors used in devices such as servers. Correspondingly, a connector described in Patent Literature 1 has been proposed in order to downsize such connectors.

CITATION LIST

Patent Literature

Patent Literature 1: Japanese Patent No. 4613484

SUMMARY OF INVENTION

Technical Problem

However, it is necessary to dispose a spacer for suppressing the unsteadiness of a circuit board for transmission, between a shielding case and a circuit board for transmission in a connector described in Patent Literature 1. Therefore, it is difficult to downsize the connector described in Patent Literature 1.

The present disclosure was made in view of the above-described problems, with an objective to provide a connector that can be downsized, and to provide a method of manufacturing the connector.

Solution to Problem

In order to achieve the objective described above, a connector according to a first aspect of the present disclosure includes:
  a circuit board that is connected to an outside via a signal wire;
  a first heat transfer material that is arranged on one principal surface of the circuit board;
  a first shell of which one end is mated with a mating connector in a state in which a terminal end portion of the circuit board protrudes from the one end, and which includes an opposite opposed to at least a part of a target region which is a region other than the terminal end portion of the circuit board, covers at least a part of the target region, and is conductive;
  a second shell that is connected to another end of the first shell, covers at least a part of the target region in the one principal surface of the circuit board, is thermally conductably connected to the circuit board in contact with the first heat transfer material, and is conductive; and
  a third shell that is engaged with the second shell, covers at least a part of the target region in another principal surface of the circuit board, and is conductive,
  wherein the first shell, the second shell, and the third shell cover the target region of the circuit board.

It is also acceptable that the third shell is spaced from the first shell in a direction along the one end, or in a direction along a thickness direction of the circuit board, and opposed to the target region of the circuit board.

It is also acceptable that:
  the first shell includes a cover that is connected to the opposite, and forms, together with the opposite, an insertion portion, and
  the terminal end portion of the circuit board is inserted into the insertion portion.

It is also acceptable that the first shell is formed integrally with the second shell.

It is also acceptable that the first shell is further formed integrally with the third shell.

It is also acceptable that:
  a heat generation member is arranged on the other principal surface of the circuit board, and
  a part of the third shell is thermally conductably connected to the heat generation member via a second heat transfer material.

It is also acceptable that:
  a tongue is formed in the third shell, and
  the tongue is bent in contact with the second heat transfer material.

It is also acceptable that the heat generation member is thermally conductably connected to the circuit board via a third heat transfer material.

It is also acceptable that the heat generation member includes a semiconductor element including a silicon photonics circuit.

It is also acceptable that:
  the signal wire includes an optical fiber,
  the optical fiber is connected to a light emitting element or light receiving element included in the semiconductor element, and
  an electric terminal of the semiconductor element is connected to a plurality of connection terminals arranged on the terminal end portion via a wiring line formed on the circuit board.

It is also acceptable that:
  the second shell or the third shell includes an engager arranged on one end thereof, and
  the first shell includes a portion to be engaged, which is arranged on the other end, and is engaged with the engager.

It is also acceptable that the first shell includes: an engagement claw that is engaged with the circuit board; and a presser that presses the other principal surface of the circuit board.

It is also acceptable that an insertion opening into which the signal wire is inserted is opened in at least one of the second shell and the third shell.

It is also acceptable that the first heat transfer material is a fixation material with which the circuit board is fixed on the second shell.

In order to achieve the objective described above, a connector according to a second aspect of the present disclosure includes:

a circuit board that is connected to an outside via a signal wire;

a fixation member with which fixation of the circuit board is performed;

a first shell of which one end is mated with a mating connector in a state in which a terminal end portion of the circuit board protrudes from the one end, and which covers at least a part of a target region which is a region other than the terminal end portion of the circuit board, and is conductive;

a second shell that is connected to another end of the first shell, covers at least a part of the target region in one principal surface of the circuit board, and is conductive; and a third shell that is connected to the other end of the first shell, is engaged with the second shell, covers at least a part of the target region in another principal surface of the circuit board, and is conductive, wherein the first shell, the second shell, and the third shell cover the target region of the circuit board, and the fixation is performed with the fixation member so that at least a part of the target region in the one principal surface of the circuit board comes into contact with a principal surface of the second shell.

In order to achieve the objective described above, a method of manufacturing a connector according to a third aspect of the present disclosure includes:

allowing a terminal end portion of a circuit board that is connected to an outside via a signal wire to protrude from one end of a first shell that is mated with a mating connector;

arranging a heat transfer material on one principal surface of the circuit board;

engaging a second shell with the first shell and bringing the second shell into intimate contact with the heat transfer material; and sliding a third shell along the second shell, engaging the third shell with the first shell, and covering a region other than the terminal end portion of the circuit board with the first shell, the second shell, and the third shell, wherein the first shell, the second shell, and the third shell are fixed to each other.

In order to achieve the objective described above, a connector according to a fourth aspect of the present disclosure includes:

a circuit board that is connected to an outside via a signal wire;

a thermally-conductive fixation material that is arranged on one principal surface of the circuit board;

a first shell in which an insertion portion into which a terminal end portion of the circuit board is inserted is formed on one end, of which the one end is mated with a mating connector in a state in which the terminal end portion of the circuit board protrudes from the one end, and which covers at least a part of a target region which is a region other than the terminal end portion of the circuit board, and is conductive;

a second shell that is connected to another end of the first shell, covers at least a part of the target region in the one principal surface of the circuit board, comes into contact with the fixation material to perform fixation of the circuit board, and is conductive; and a third shell that is connected to the other end of the first shell, is engaged with the second shell, covers at least a part of the target region in another principal surface of the circuit board, and is conductive, wherein the first shell, the second shell, and the third shell cover the target region of the circuit board.

Advantageous Effects of Invention

In accordance with the present disclosure, a connector can be downsized, and the downsized connector can be manufactured.

BRIEF DESCRIPTION OF DRAWINGS

FIG. 14A is a perspective view of a lower shell and a front shell according to Alternative Example 2 of the present disclosure;

FIG. 14B is a cross-sectional view of the lower shell and the front shell, taken along the line XIVB-XIVB in FIG. 14A;

FIG. 15A is a perspective view of a circuit board according to Alternative Example 2 of the present disclosure;

FIG. 15B is a cross-sectional view of the circuit board, taken along the line XVB-XVB in FIG. 15A;

FIG. 16A is a perspective view of the lower shell, the front shell, and the circuit board according to Alternative Example 2 of the present disclosure;

FIG. 16B is a cross-sectional view of the lower shell, the front shell, and the circuit board, taken along the line XVIB-XVIB in FIG. 16A;

FIG. 19 is a view illustrating a method of manufacturing the connector according to Embodiment 2 of the present disclosure, in which

FIG. 20 is an exploded perspective view of a connector according to Embodiment 3 of the present disclosure;

DESCRIPTION OF EMBODIMENTS

Figure 1A:
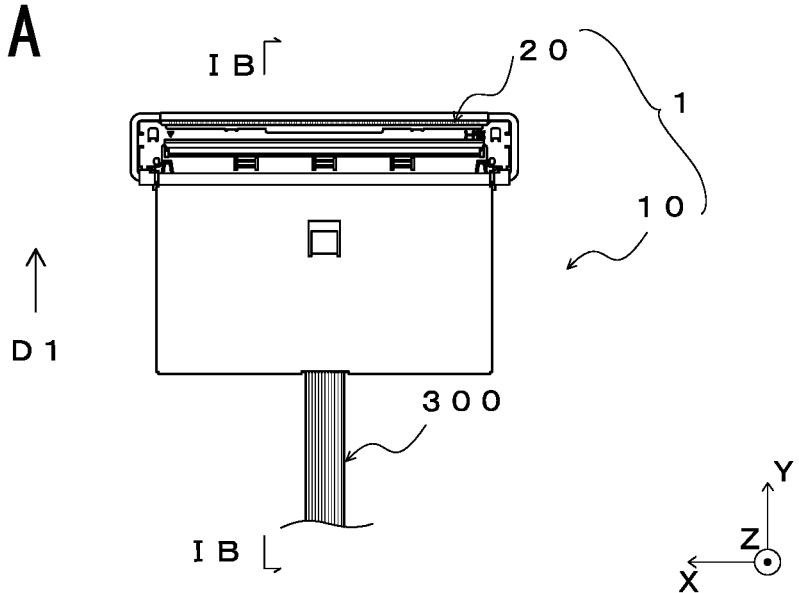
FIG. 1A is a plan view of a connector unit according to Embodiment 1 of the present disclosure.

A connector unit including a connector according to each embodiment of the present disclosure will be described below with reference to the drawings. In the drawings, the XYZ coordinates orthogonal to each other are set, and reference to the XYZ coordinates is made as appropriate. The Y-axis direction of the XYZ coordinates is a direction (forward-backward direction) identical to a mating direction D1 in which a connector 10 is moved to be mated with a mating connector 20, as illustrated in FIG. 1A. The Z-axis direction is a direction (upward-downward direction) identical to the thickness direction of the circuit board 200 of the connector 10. The X-axis direction is a direction (crosswise direction) orthogonal to both the Y-axis and Z-axis directions. The same components are denoted by the same reference characters.

Embodiment 1

A connector unit 1 is, for example, a unit for an active optical cable (AOC) connector used in a graphic processing unit (GPU), a field programmable gate array (FPGA), or the like in a server. The connector unit 1 includes the connector 10 and the mating connector 20 according to Embodiment 1.

The connector 10 is a male connector that is connected to the mating connector 20 which is a female connector, as illustrated in FIG. 1A.

Figure 1B:
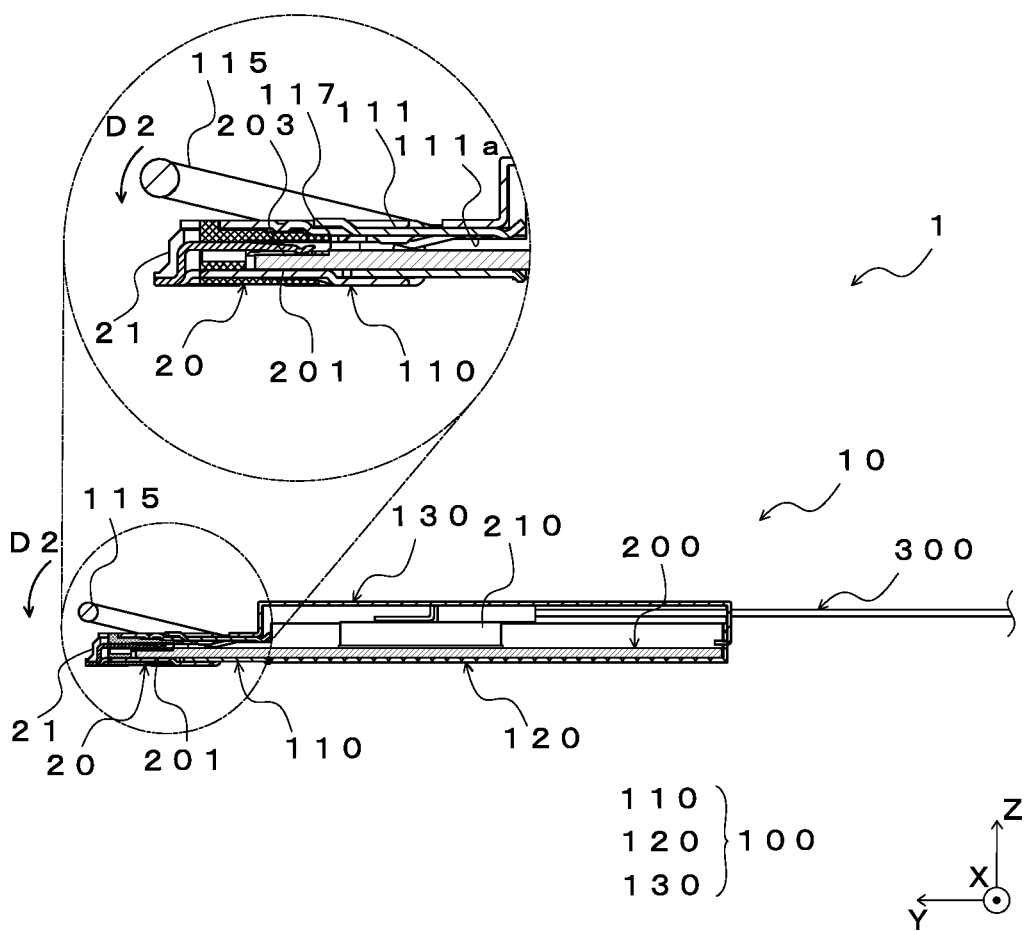
FIG. 1B is a cross-sectional view of the connector unit, taken along the line IB-IB in FIG. 1A.

As illustrated in a cross section, taken along the line IB of FIG. 1A, in FIG. 1B, the connector 10 includes: the circuit board 200 on which a printed circuit is formed; a semiconductor element 210 arranged on the circuit board 200; a signal wire 300 connected to the semiconductor element 210; and a housing 100 that houses the circuit board 200 excluding a terminal end portion 201 and the base of the signal wire 300. The mating connector 20 is connected to connection terminals 203 (see FIG. 7) aligned on the terminal end portion 201 of the circuit board 200.

The connector 10 receives an optical signal through the signal wire 300, and allows the semiconductor element 210 mounted on the circuit board 200 to convert the optical signal into an electric signal, and to process the electric signal. Then, the electric signal is transmitted to the mating connector 20 through the printed circuit on the circuit board 200 and the connection terminals 203 aligned on the terminal end portion 201. Moreover, the connector 10 transmits the electric signal, transmitted from the mating connector 20, to the semiconductor element 210 through the printed circuit and the connection terminals 203 aligned on the terminal end portion 201. Then, the semiconductor element 210 processes the electric signal, the electric signal is converted into an optical signal, and the optical signal is transmitted to the outside through the signal wire 300.

The configuration of the connector 10 will now be described in more detail.

Figure 2A:
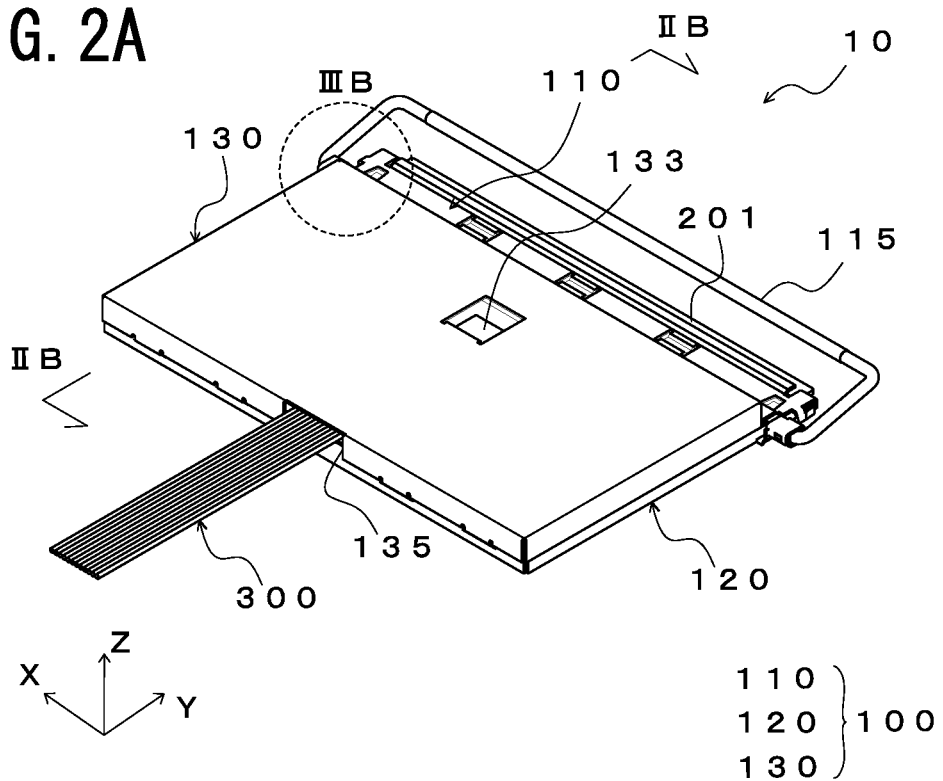
FIG. 2A is a perspective view of a connector according to Embodiment 1 of the present disclosure.
Figure 2B:
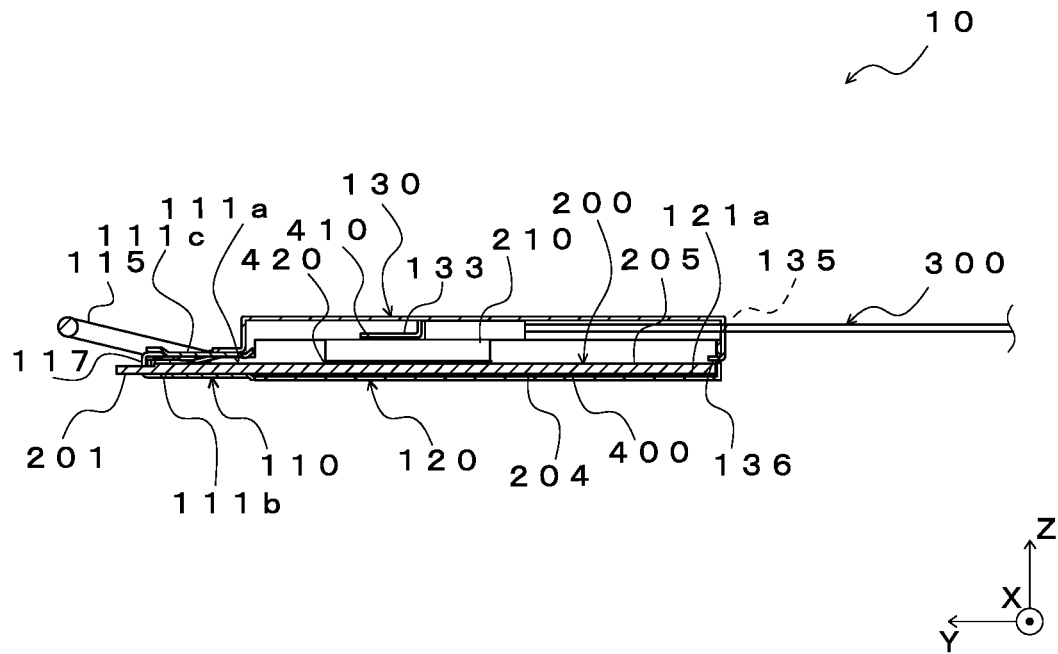
FIG. 2B is a cross-sectional view of the connector, taken along the line IIB-IIB in FIG. 2A.

As illustrated in FIG. 2A and FIG. 2B which is a cross-sectional view taken along the line IIB of FIG. 2A, the connector 10 includes: the circuit board 200; the semiconductor element 210 arranged on the circuit board 200; the signal wire 300 that is connected to the semiconductor element 210; and the housing 100 that houses the circuit board 200 excluding the terminal end portion 201 and the base of the signal wire 300.

The housing 100 is, for example, a conductive member including a metal. The housing 100 houses the circuit board 200 excluding the terminal end portion 201. The housing 100 includes: a front shell 110 that allows the terminal end portion 201 of the circuit board 200 to protrude; a lower shell 120 with which the lower portion of the circuit board 200 is fixed; and an upper shell 130 that is arranged in the upper portion of the circuit board 200. The front shell 110 is an example of a first shell, the lower shell 120 is an example of a second shell, and the upper shell 130 is an example of a third shell.

Figure 3A:
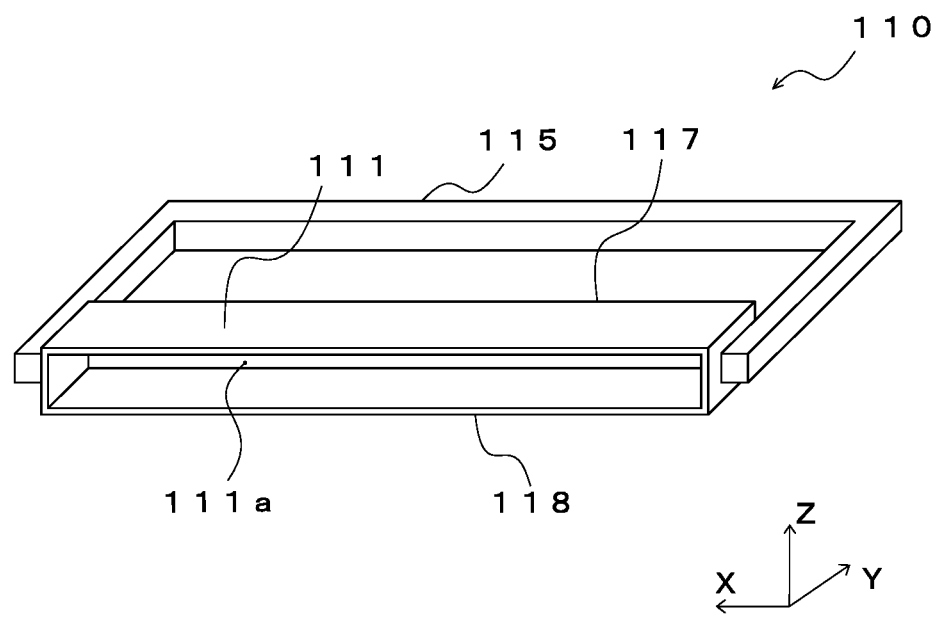
FIG. 3A is a perspective view illustrating the skeletal form of a front shell according to Embodiment 1 of the present disclosure.

The front shell 110 is a member that allows the terminal end portion 201 of the circuit board 200 to protrude to the (forward) outside of the housing 100, and covers the circuit board 200. In a skeletal form as illustrated in FIG. 3A, the front shell 110 includes: a body 111 having a square cylindrical shape; and a generally C-shaped latch 115 that is rotatably locked on both ends of the body 111 in the X-axis direction.

Figure 4A:
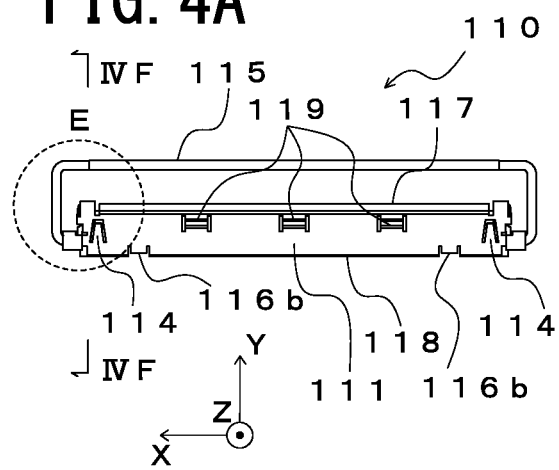
FIG. 4A is a plan view of the front shell according to Embodiment 1 of the present disclosure.
Figure 4D:
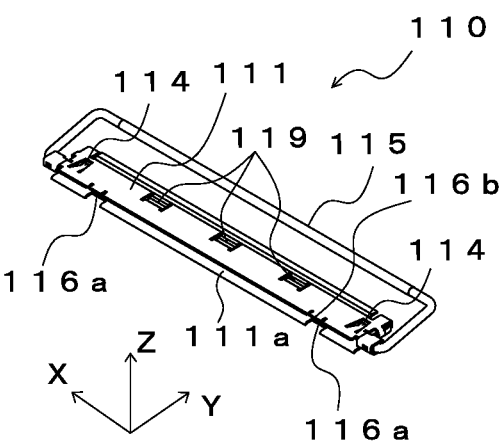
FIG. 4D is a perspective view of the front shell according to Embodiment 1 of the present disclosure.

Specifically, the front shell 110 includes the body 111 and the latch 115, as illustrated in a plan view in FIG. 4A and in a perspective view in FIG. 4D.

Figure 4B:
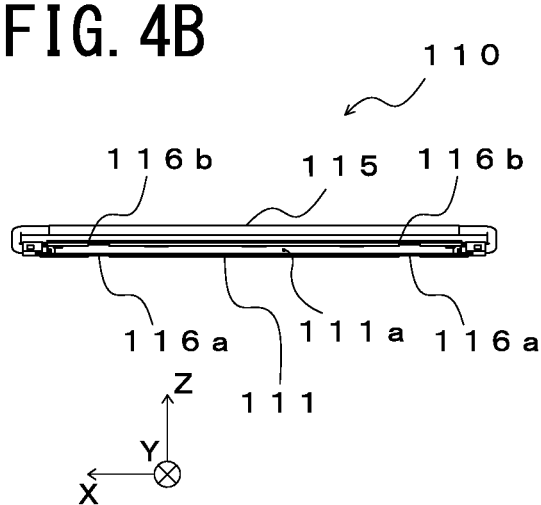
FIG. 4B is a rear view of the front shell according to Embodiment 1 of the present disclosure.

The body 111 is included in the body portion of the front shell 110, and an insertion portion 111a corresponding to a hollow portion that penetrates the body 111 in the Y-axis direction (forward-backward direction) is formed in the body 111. As illustrated in FIG. 1B, the front end (one end) 117 of the body 111, together with the terminal end portion 201 of the circuit board 200, is mated with the mating connector 20. As illustrated in FIG. 4F, the rear end (other end) 118 of the body 111 is formed so as to spread in the Z-axis direction (upward-downward direction), in order to form a space for inserting the circuit board 200 into the front shell 110. As illustrated in FIG. 2B and FIG. 4F, the body 111 includes: an opposite 111b that is opposed to one principal surface 204, described below, of the circuit board 200; a cover 111c that is opposed to another principal surface 205, described below, of the circuit board 200; and connections 111d that connect the opposite 111b and the cover 111c to each other. The opposite 111b and the cover 111c are arranged to be opposed to each other in the state of being apart from each other in the Z-axis direction (upward-downward direction). The connections 111d connect an end of the opposite 111b in the +Y-direction (forward direction) and an end of the cover 111c in the +Y-direction (forward direction) to each other. The connections 111d are disposed on both ends of the front end 117 of the body 111 in the X-axis direction, respectively. In the front end (one end) 117 of the body 111, the insertion portion 111a is formed by the opposite 111b, the cover 111c, and the connections 111d.

As illustrated in FIGS. 1 and 2, the terminal end portion 201 of the circuit board 200 is inserted into the insertion portion 111a, and the terminal end portion 201 protrudes from the front end 117 of the front shell 110.

Figure 4E:
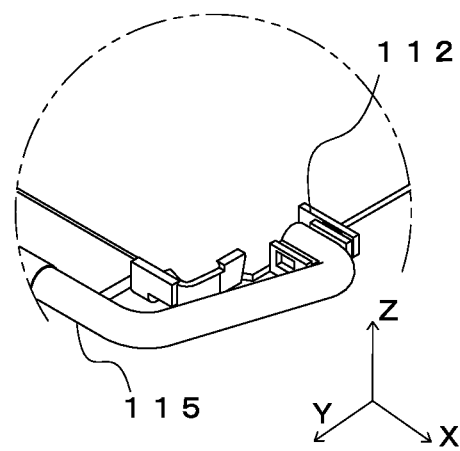
FIG. 4E is an enlarged perspective view of a portion obtained by omitting the +Z-side body of a portion E of FIG. 4A from the portion E.

As illustrated in FIG. 4A and FIG. 4E which is an enlarged view of the portion e of FIG. 4A, portions to be engaged 112 which is a plate-shaped member including a principal surface in the XZ plane are formed on both ends of the body 111 in the X-axis direction (crosswise direction). The engagers 123, described below, of the lower shell 120 are engaged with the portions to be engaged 112.

Figure 4C:
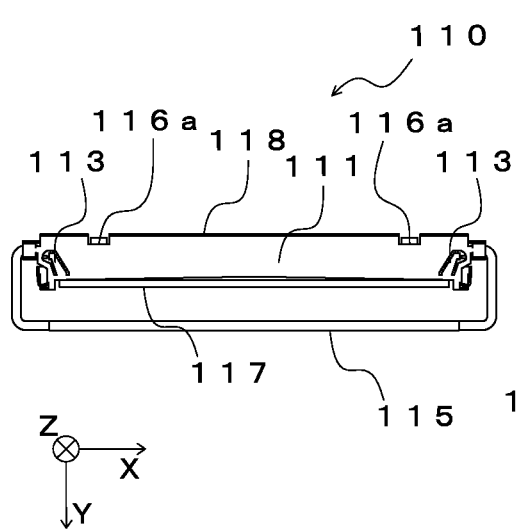
FIG. 4C is a bottom view of the front shell according to Embodiment 1 of the present disclosure.
Figure 4F:
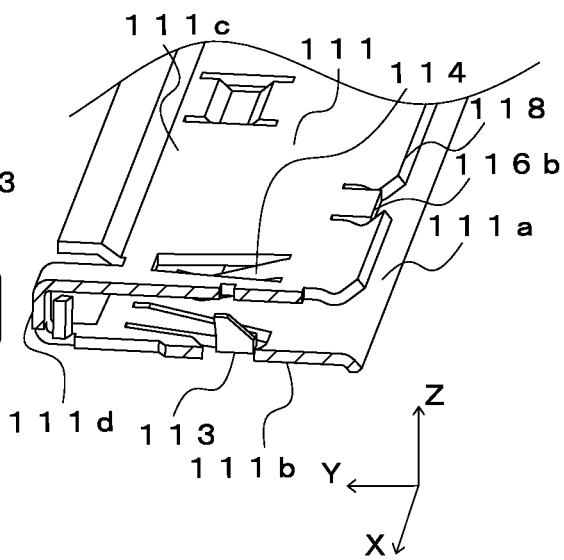
FIG. 4F is a cross-sectional view of the front shell, taken along the line IVF-IVF in FIG. 4A.

As illustrated in FIGS. 4C and 4F, engagement claws 113 which are hook-shaped members that protrude into the insertion portion 111a are formed in the vicinities of both ends of the body 111 in the X-axis direction (crosswise direction). The engagement claws 113 are engaged with the projections 202, described below, of the circuit board 200 inserted into the insertion portion 111a, and prevent the circuit board 200 from falling out of the front shell 110.

As illustrated in FIGS. 4A, 4D, and 4F, pressers 114 that press the circuit board 200 inserted into the insertion portion 111a are formed in the vicinities of both ends of the upper wall of the body 111 in the X-axis direction (crosswise direction). Each of the pressers 114 is formed of an L-shaped tongue that has elasticity, and protrudes from the body 111 toward the interior of the insertion portion 111a. As a result, the pressers 114 press, in the −Z-direction, the circuit board 200 inserted into the insertion portion 111a.

As illustrated in FIGS. 4C and 4D, soldering portions 116a are formed in the −Z-side (lower side) of the rear end 118 of the body 111. The soldering portions 116a include concave portions in the XY plane view. The deviations of the front shell 110 and the lower shell 120 in the Y-axis-direction (forward-backward direction) are suppressed by arranging the protrusions 125, described below, of the lower shell 120 in the concave portions of the soldering portions 116a. Moreover, gaps between the soldering portions 116a and the protrusions 125 are soldered to fix the front shell 110, the lower shell 120, and the circuit board 200 to each other.

Figure 3B:
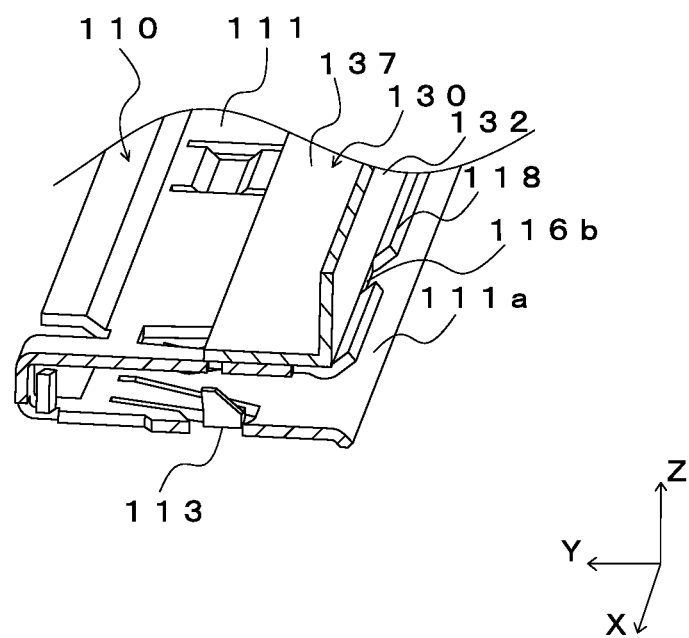
FIG. 3B is an enlarged sectional perspective view of a portion IIIB in FIG. 2A.

As illustrated in FIGS. 4A, 4D, and 4F, an abutment 116b is formed in the +Z-side (upper side) of the rear end 118 of the body 111. The abutment 116b includes a plate-shaped tongue portion, and the tongue portion is in the vicinity of the other principal surface 205 of the circuit board 200. When the upper shell 130 is mounted on the front shell 110, the tongue portion of the abutment 116b of the front shell 110 abuts on the −Y-direction (backward direction) end of the abutment 137, described below, of the upper shell 130, as illustrated in FIG. 3B.

As illustrated in FIGS. 4A and 4D, recesses 119 are disposed in the +Z-side (upper side) of the front end 117 of the body 111. The recesses 119 are recessed in the −Z-direction (downward direction). The projections (not illustrated) of the mating connector 20 are mated with the recessed portions of the recesses 119 in a state in which the connector 10 is connected to the mating connector 20.

As illustrated in FIG. 4E, the latch 115 is a generally C-shaped member of which both ends are rotatably engaged with both ends of the body 111 in the X-axis direction (crosswise direction). The latch 115 is hooked on a wall surface 21 of the mating connector 20 in the +Y-direction (forward direction) by rotationally moving the latch 115 in the D2 direction in a state in which the terminal end portion 201 of the circuit board 200 is connected to the mating connector 20, as illustrated in FIG. 1B. As a result, the latch 115 prevents the circuit board 200 from falling out of the mating connector 20.

Figure 5A:
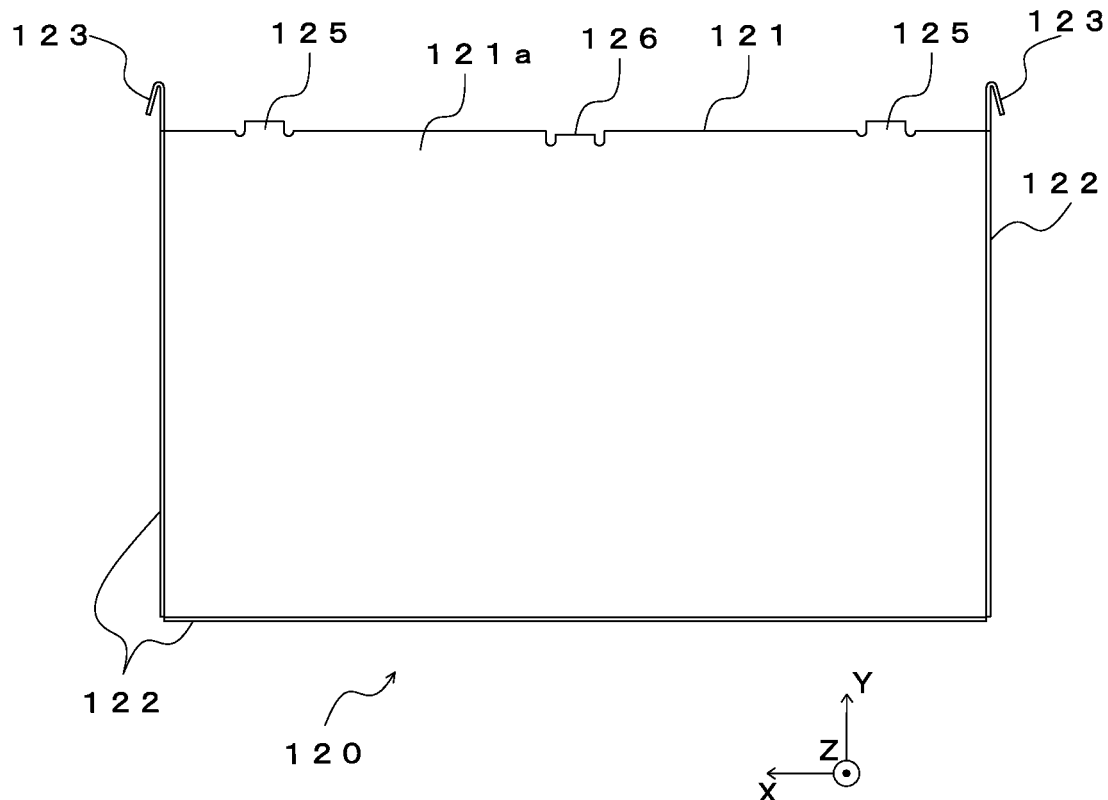
FIG. 5A is a plan view of a lower shell according to Embodiment 1 of the present disclosure.
Figure 5B:
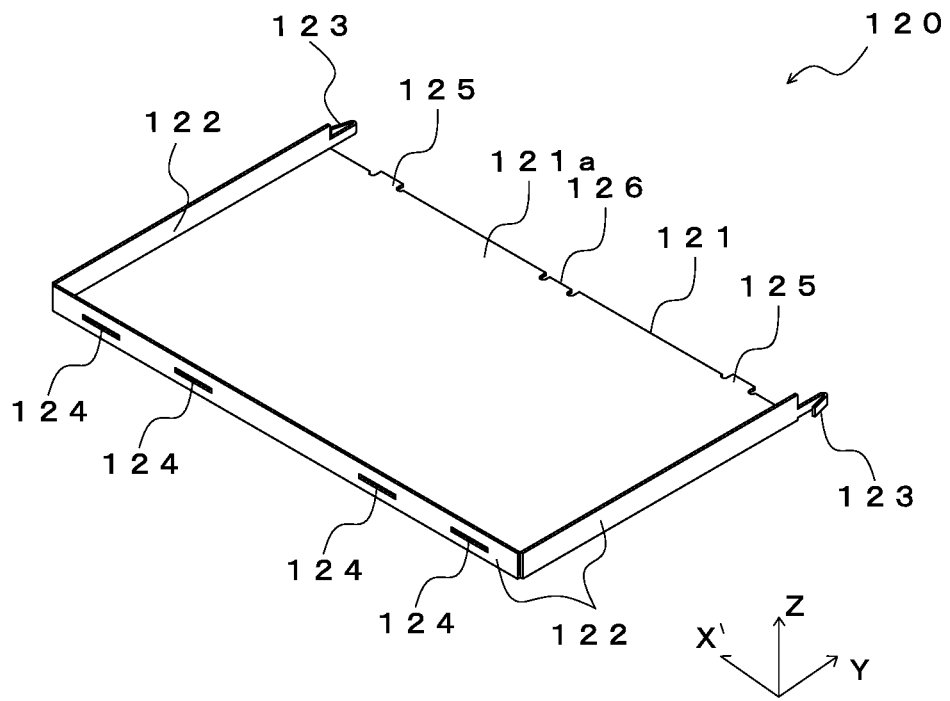
FIG. 5B is a perspective view of the lower shell according to Embodiment 1 of the present disclosure.

The lower shell 120 included in the housing 100 includes a base 121, risers 122, and the engagers 123 in a pair, as illustrated in FIGS. 5A and 5B. The lower shell 120 is a member that covers at least a part of a target region which is a region other than the terminal end portion 201 of the circuit board 200, and supports the circuit board 200.

The base 121 is a flat-plate-shaped member having a generally rectangular shape. The circuit board 200 is arranged on a principal surface 121a of the base 121 via a fixation material 400 described below.

The protrusions 125 in a pair are formed on the +Y-direction (front) end of the base 121. The protrusions 125 are flat-plate-shaped members that are arranged in the recesses of the soldering portions 116a disposed in the −Z-side (lower side) of the rear end 118 of the front shell 110 in a case in which the lower shell 120 is engaged with the front shell 110.

A soldering portion 126 is formed in the +Y-direction (front) central portion of the base 121. The soldering portion 126 includes recesses for fixing the front shell 110, the lower shell 120, and the circuit board 200 with solder.

The risers 122 are members that form walls rising from both X-direction ends and −Y-direction (rear and side) ends of the base 121.

A plurality of engagement holes 124 is formed in the riser 122 of the −Y-direction end (rear end). Each of the engagement holes 124 is formed in a generally rectangular shape. The engagers 136, described below, of the upper shell 130 are engaged with the engagement holes 124.

Figure 11:
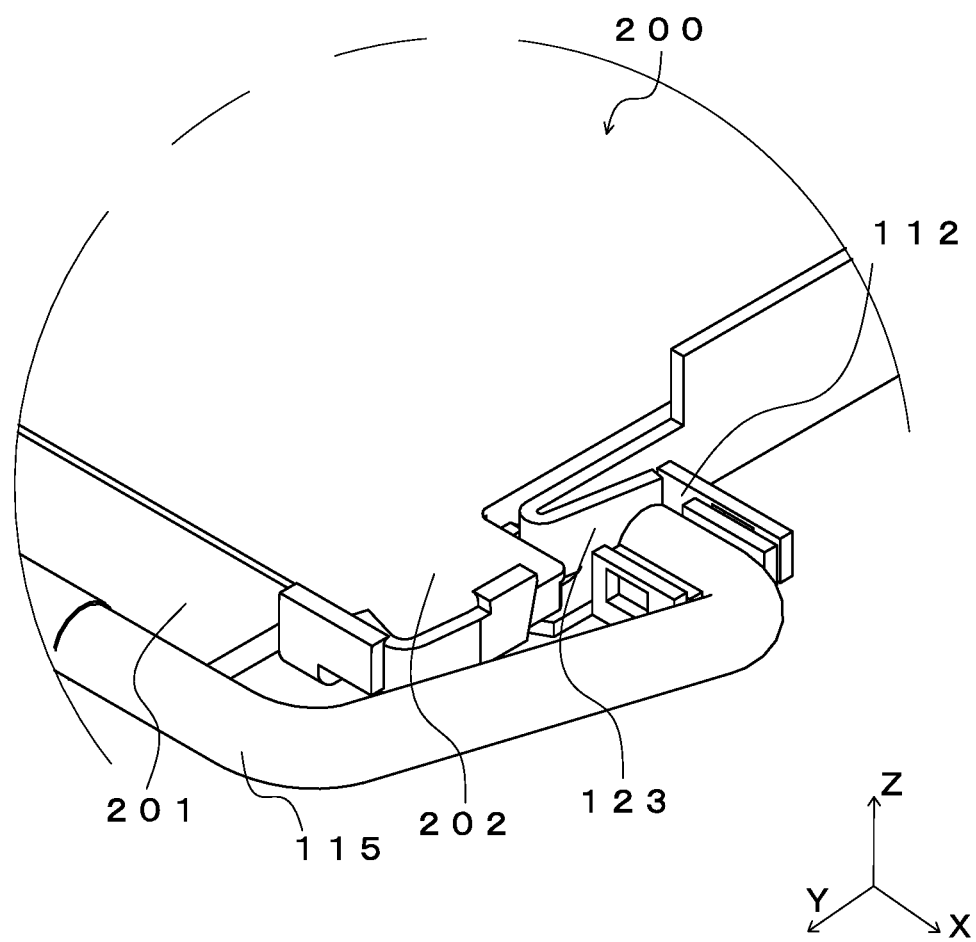
FIG. 11 is an enlarged sectional perspective view of a portion obtained by omitting the +Z-side body of the front shell of FIG. 10B from a portion XI.

The engagers 123 are hook-shaped members formed in the +Y-direction ends (front ends) in the risers 122 of both the X-axis-direction ends (both crosswise-direction ends). As illustrated in FIG. 11, the engagers 123 are engaged with the portions to be engaged 112 in a state in which the lower shell 120 is connected to the front shell 110. The engagers 123 have structures in which the engagers 123 are prevented from easily falling out of the portions to be engaged 112 when the engagers 123 are engaged with the portions to be engaged 112, because the hook-shaped portions of the engagers 123 in a pair are outwardly formed, and the portions to be engaged 112 in a pair are formed outside the engagers 123.

Figure 6A:
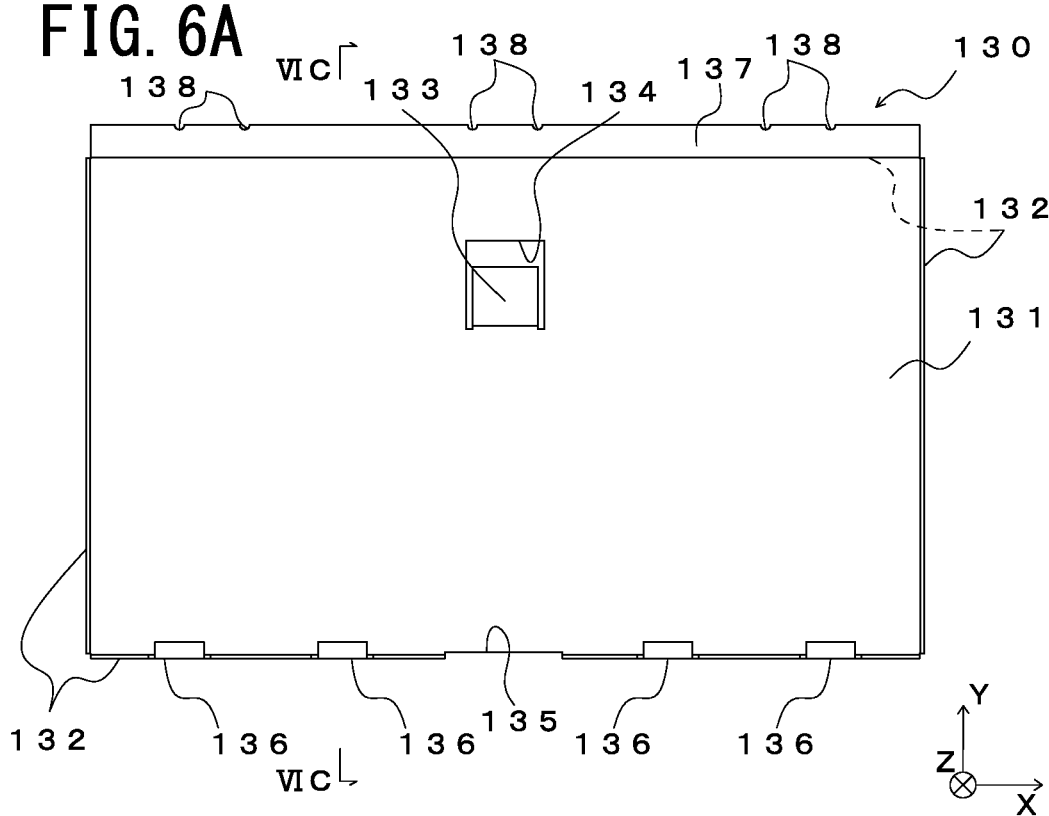
FIG. 6A is a bottom view of an upper shell according to Embodiment 1 of the present disclosure.
Figure 6B:
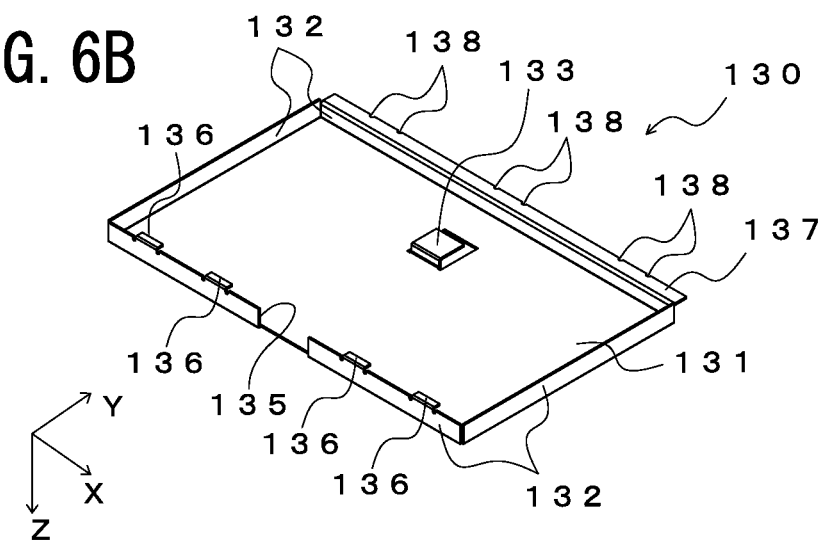
FIG. 6B is a perspective view of the upper shell according to Embodiment 1 of the present disclosure.
Figure 6C:
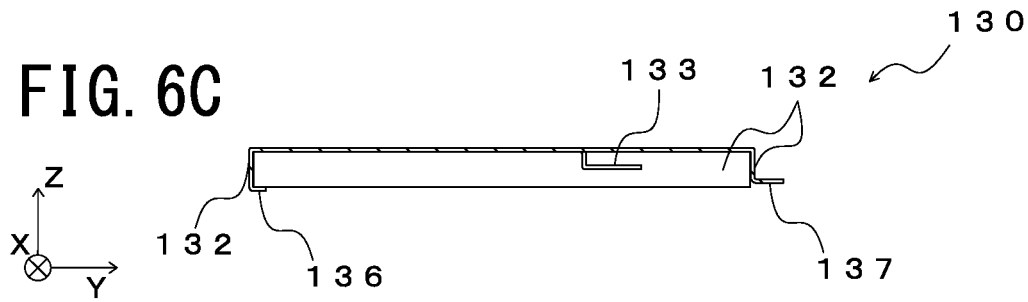
FIG. 6C is a cross-sectional view of the upper shell, taken along the line VIC-VIC in FIG. 6A.

Moreover, the upper shell 130 included in the housing 100 includes a base 131, risers 132, a tongue 133, and the abutment 137, as illustrated in FIGS. 6A to 6C. The upper shell 130 covers at least a part of the target region (the region other than the terminal end portion 201) of the circuit board 200.

The base 131 is a flat-plate-shaped member having a generally rectangular shape, of which the vicinity of the center is incised to form the tongue 133. The lengths of the short and long sides of the base 131 of the upper shell 130 are slightly longer than the lengths of the short and long sides of the base 121 of the lower shell 120, respectively. As a result, the upper shell 130 can house the upper ends of the risers 122 of the lower shell 120.

The tongue 133 is a member having a generally square shape in the XY plane view, which is formed to be bent from the base 131 toward the −Z-direction (the downward direction, the direction toward a place in which the semiconductor element 210 is arranged). The tongue 133 is a member for promoting dissipation of heat from the semiconductor element 210, described below, of the circuit board 200. A gap 134 is formed between the base 131 and the tongue 133, and air in the housing 100, heated by the semiconductor element 210, is released from the gap 134 to the outside.

The risers 132 are members that form wall surfaces rising from four sides of both X-direction ends and both Y-direction ends of the base 131. Both the X-direction ends and the −Y-direction end (crosswise direction and backward direction) of the risers 132 of the upper shell 130 are arranged to overlap both the X-direction ends and the −Y-direction end (crosswise direction and backward direction) of the risers 122 of the lower shell 120.

An insertion opening 135 for passing the signal wire 300 is formed in the vicinity of the center of the −Y-direction (backward-direction) wall of the risers 132.

Moreover, a plurality of engagers 136 is formed toward the +Y direction (forward direction) on the top (end in the −Z-direction) of the −Y-direction (backward-direction) wall of the risers 132. Each engager 136 is a member having a generally rectangular shape. The engagers 136 are engaged with the engagement holes 124 formed in the riser 122 of the lower shell 120.

An abutment 137 is a plate-shaped member formed on the −Z-direction end (lower end) of the riser 132 of the +Y-direction end (front end). The abutment 137 of the upper shell 130 abuts on the +Z-direction surface of the body 111 of the front shell 110 and the abutment 116b of the front shell 110.

A plurality of recesses 138 having a concave shape is formed on the +Y-direction (forward-direction) end of the abutment 137. Portions between the recesses 138, 138 adjacent to each other are soldered to fix the upper shell 130 to the front shell 110 in a state in which the abutment 137 of the upper shell 130 abuts on the front shell 110.

Figure 7A:
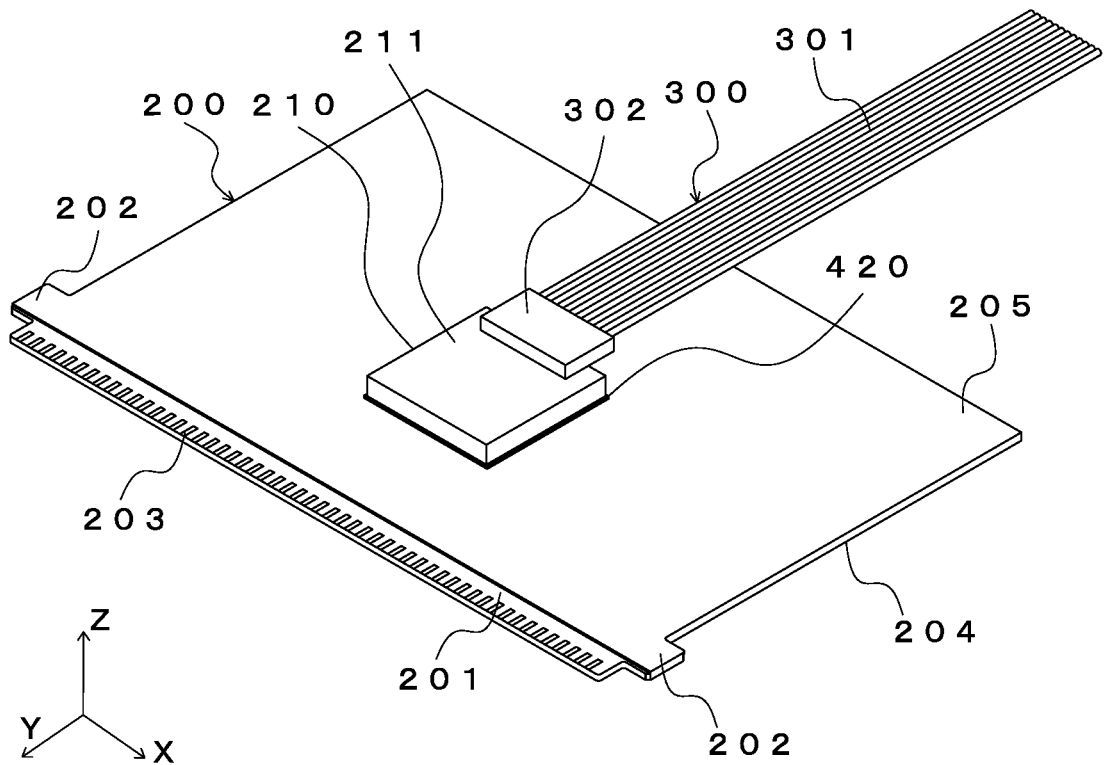
FIG. 7A is a perspective view of a circuit board and a signal wire according to Embodiment 1 of the present disclosure.
Figure 7B:
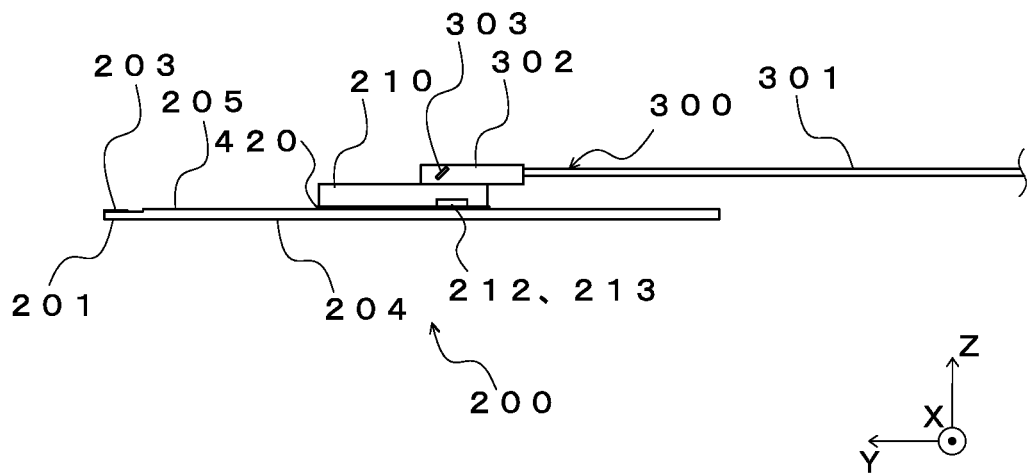
FIG. 7B is a side view of the circuit board and the signal wire according to Embodiment 1 of the present disclosure.

The circuit board 200 is an active optical cable (AOC) substrate, and includes the projections 202 in a pair and the connection terminals 203, as illustrated in FIGS. 7A and 7B.

The circuit board 200 is fixed on the principal surface 121a of the lower shell 120 via the fixation material 400, as illustrated in FIG. 2B, and is thermally conductably connected to the lower shell 120.

The terminal end portion 201 is the +Y-side (front-side) end of the circuit board 200, as illustrated in FIGS. 7A and 7B. The terminal end portion 201 is a portion that protrudes from the front end 117 of the front shell 110 when the circuit board 200 is inserted from the rear end 118 into the front shell 110 in the +Y-direction (forward direction).

Figure 9:
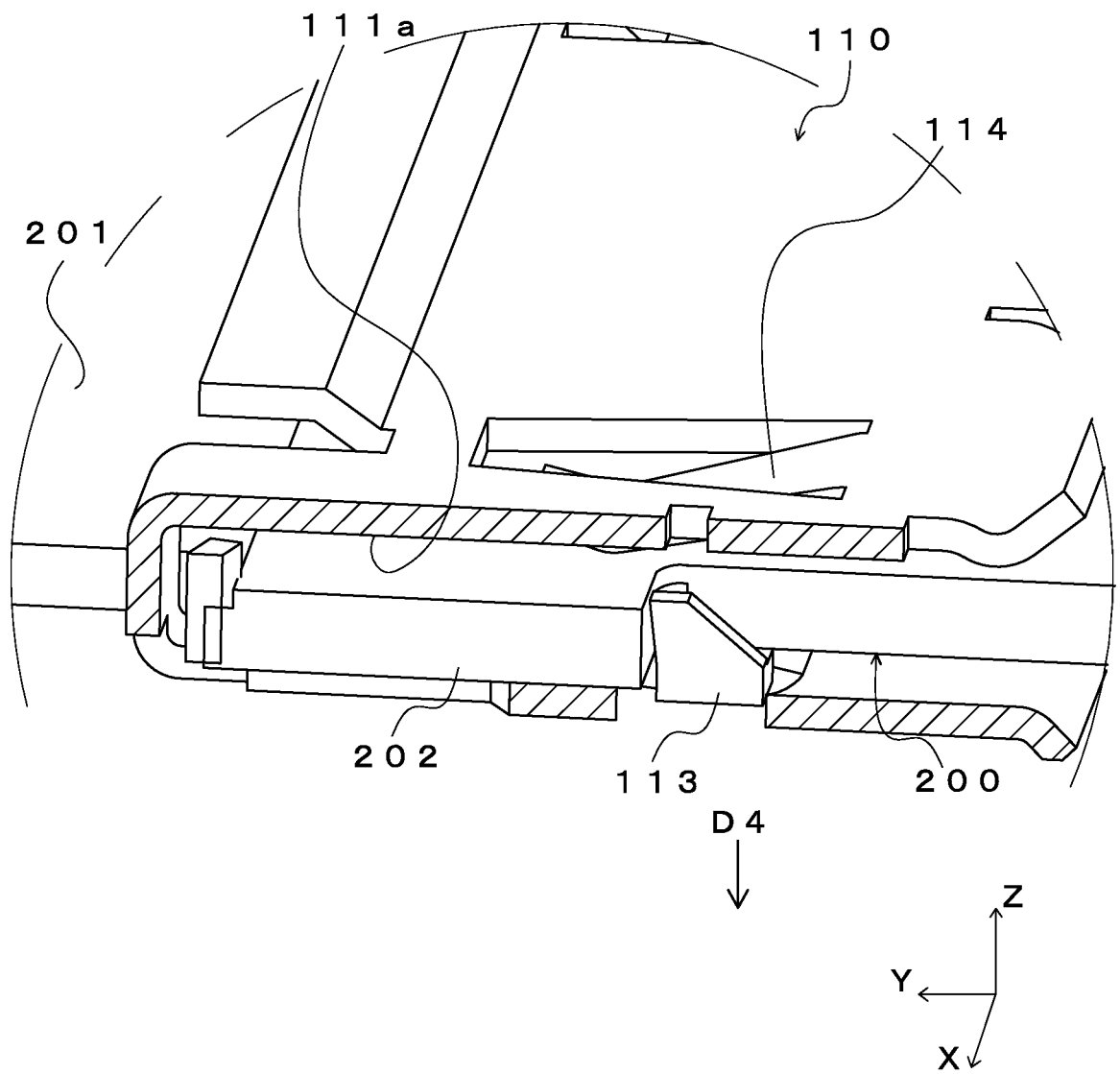
FIG. 9 is an enlarged sectional perspective view of a state in which the circuit board is inserted into the front shell of FIG. 4F.

The projections 202 are portions formed to protrude outward from both the X-axis-direction (crosswise-direction) ends of the terminal end portion 201. As illustrated in FIG. 9, the projections 202 are engaged with the hook-shaped portions of the engagement claws 113 to prevent the circuit board 200 from falling out of the front shell 110 in a state in which the circuit board 200 is inserted to a predetermined position in the insertion portion 111a.

The plurality of connection terminals 203 is formed on the other principal surface 205 of the terminal end portion 201, as illustrated in FIGS. 7A and 7B. The connection terminals 203 are connected to the connection terminals of the mating connector 20.

The semiconductor element 210 is a heat generation member including a silicon photonics circuit, includes a light emitting element 212, a light receiving element 213, an electric terminal, and the like, and is mounted on the circuit board 200. For example, a laser diode (LD) as the light emitting element 212, for example, a photo diode (PD) as the light receiving element 213, and, in addition, a component such as a driver are integrated in the silicon photonics circuit. The electric terminal of the semiconductor element 210 is connected to the connection terminals 203 arranged on the terminal end portion 201 through a wiring line formed on the circuit board 200. The semiconductor element 210 is thermally conductably connected to the tongue 133 of the upper shell 130 via a heat transfer material 410, as illustrated in FIG. 2B. Moreover, the semiconductor element 210 is thermally conductably connected to the circuit board 200 via a heat transfer material 420 on the other principal surface 205 of the circuit board 200.

The signal wire 300 includes an optical fiber 301 and a connection 302, as illustrated in FIGS. 7A and 7B. One end of the optical fiber 301 is connected to the connection 302, and the other end of the optical fiber 301 is connected to an external portion (external instrument or the like). The connection 302 is connected to the semiconductor element 210. A reflecting mirror 303 is arranged on the connection 302. The reflecting mirror 303 reflects and bends light emitted from the optical fiber 301 or light emitted from the light emitting element 212. The reflecting mirror 303 allows the semiconductor element 210 and the signal wire 300 to be connected to each other to enable transmission of light.

The fixation material 400 includes an adhesive, for example, a silver paste, of which the heat transfer property is higher than that of a common adhesive made of resin. The fixation material 400 is filled between the one principal surface 204 of the circuit board 200 including a portion just under the semiconductor element 210 and the principal surface 121a of the base 121 of the lower shell 120, as illustrated in FIG. 2B. When a wiring line is also formed on the one principal surface 204 of the circuit board 200, a surface of the wiring line is subjected to insulation processing. The fixation material 400 has the function of fixing the circuit board 200 on the lower shell 120, and the function of transmitting heat from the circuit board 200 to the lower shell 120 to dissipate the heat. The fixation material 400 is not limited to a solid, but may be sol, gel, or the like. For example, heat dissipation grease such as heat conduction grease, a heat dissipation sheet, or the like may be used (an example of a first heat transfer material).

The heat transfer materials 410 and 420 are thermally-conductive members, and, for example, a silver paste is used in the heat transfer materials 410 and 420 in the present embodiment.

The heat transfer material 410 performs the function of transmitting heat generated in the semiconductor element 210 to the tongue 133 of the upper shell 130 to dissipate the heat in the whole upper shell 130. The heat transfer material 410 is an example of a second heat transfer material.

The heat transfer material 420 performs the function of transmitting heat generated in the semiconductor element 210 to the circuit board 200 and transmitting the heat from the circuit board 200 to the lower shell 120 through the fixation material 400 to dissipate the heat in the whole lower shell 120. The heat transfer material 420 is an example of a third heat transfer material.

As illustrated in FIGS. 1A and 1B, the mating connector 20 is a female connector mounted on a substrate (not illustrated). The terminal end portion 201 of the circuit board 200 that protrudes from the connector 10 is inserted into the mating connector 20.

The mating connector 20 may include a configuration corresponding to the connector 10. The configuration of the female connector illustrated in FIGS. 1A and 1B is an example, and the shape and the like of the mating connector 20 can be changed as appropriate.

(Method of Manufacturing Connector 10)

A method of manufacturing the connector 10 including the configuration described above will now be described.

First, an operator connects the semiconductor element 210 to a contact pad on the other principal surface 205 of the circuit board 200 in which printed wiring and the connection terminals 203 are formed in advance on the terminal end portion 201.

Then, the heat transfer material 420 is filled between the circuit board 200 and the semiconductor element 210. Subsequently, the connection 302 of the signal wire 300 is connected to the predetermined position of the principal surface 211 of the semiconductor element 210, thereby resulting in a state illustrated in FIGS. 7A and 7B.

Figure 8A:
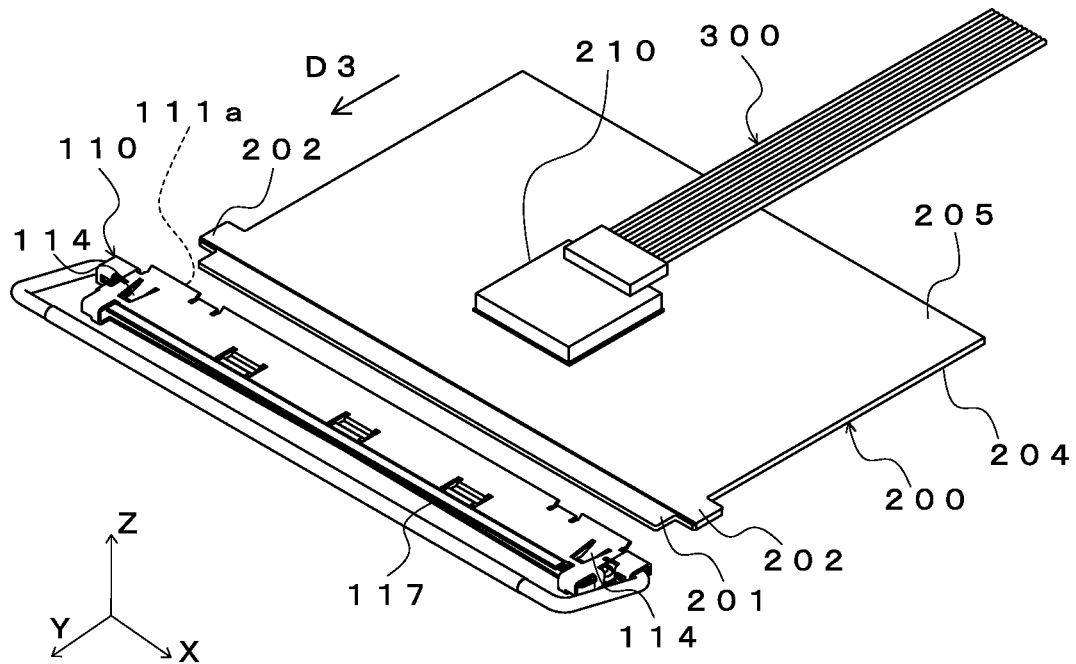
FIG. 8A is a perspective view of a state before the circuit board is inserted into the front shell.
Figure 8B:
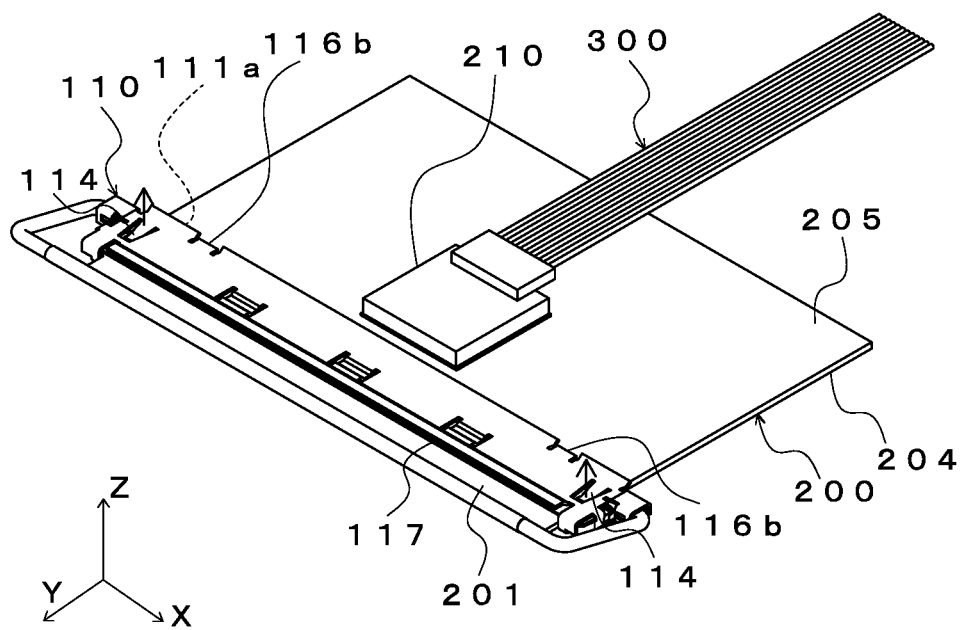
FIG. 8B is a perspective view of a state after the circuit board is inserted into the front shell.

As illustrated in FIG. 8A, the operator inserts the terminal end portion 201 of the circuit board 200 into the insertion portion 111a of the front shell 110 while directing the other principal surface 205 at the +Z-direction (upward direction). The terminal end portion 201 of the circuit board 200 protrudes from the front end 117, thereby resulting in a state illustrated in FIG. 8B. In such a case, the circuit board 200 overrides the engagement claws 113 (pushes the engagement claw 113 in the −Z-direction and the downward direction) while bending the pressers 114 in the +Z-direction (upward direction), and the projections 202 of the circuit board 200 are then engaged with the engagement claws 113 of the front shell 110, as illustrated in FIG. 9. Moreover, the circuit board 200 is pressed in the −Z-direction by the pressers 114. When the circuit board 200 is not accurately inserted to the predetermined position in the insertion portion 111a, the projections 202 interfere with the +Z-direction rising portion of the engagement claws 113, and push the engagement claws 113 in the D4 direction (−Z-direction). Accordingly, whether the circuit board 200 is inserted to the predetermined position can be confirmed depending on whether or not the engagement claws 113 protrude in the D4 direction. After the insertion, the soldering portions 116a illustrated in FIGS. 4B and 4D, and the circuit board 200 are soldered to each other.

Figure 10A:
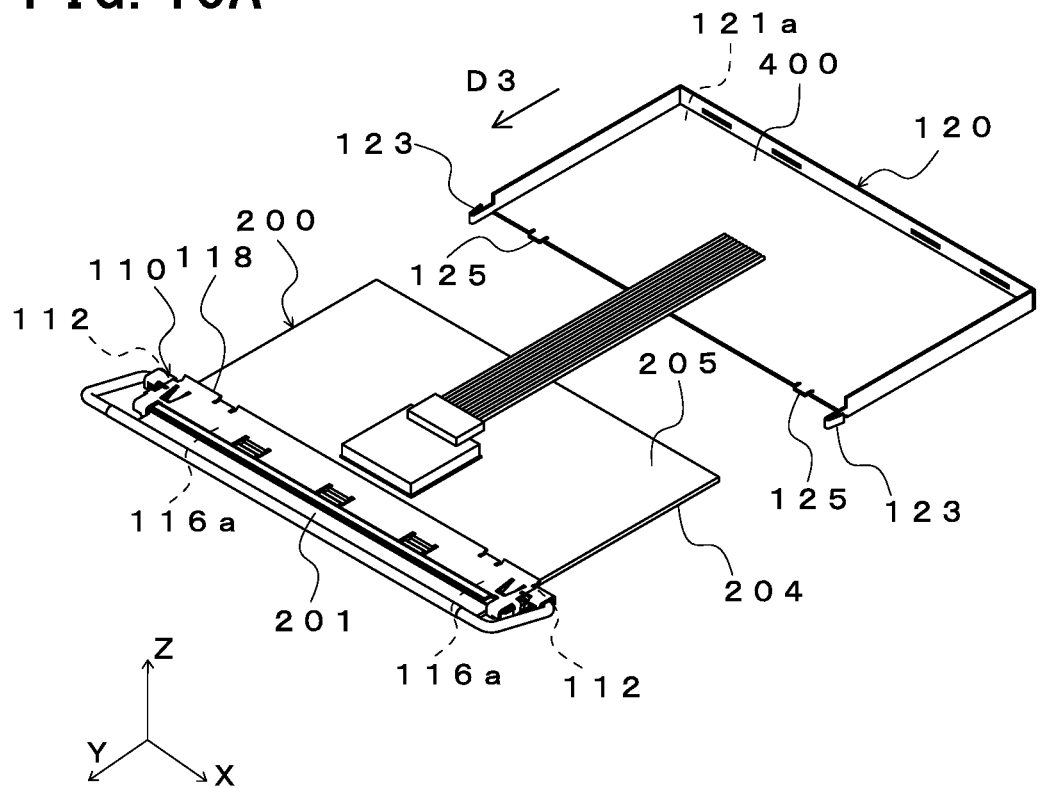
FIG. 10A is a perspective view of a state before the lower shell is engaged with the front shell.
Figure 10B:
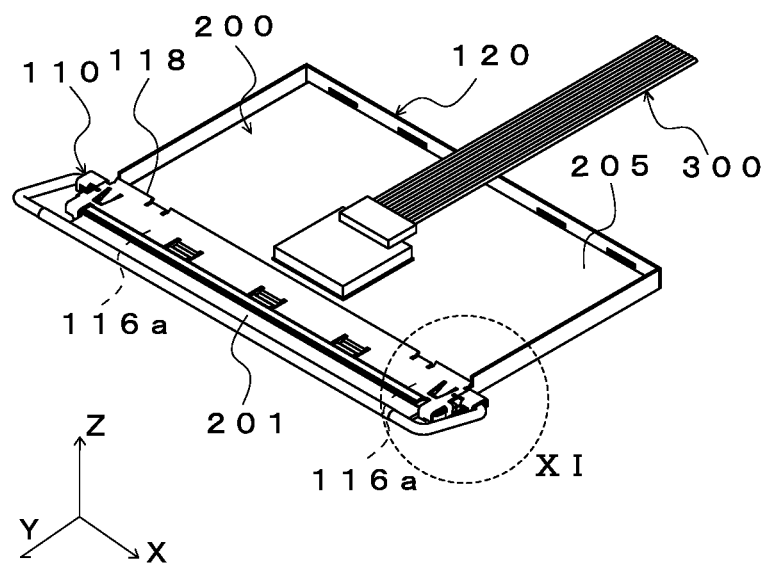
FIG. 10B is a perspective view of a state after the lower shell is engaged with the front shell.

The operator applies the fixation material 400 to the one principal surface 204 of the circuit board 200. As illustrated in FIG. 10A, the operator slides the lower shell 120 along the one principal surface 204 of the circuit board 200 in the D3 direction to engage the engagers 123 of the lower shell 120 with the portions to be engaged 112 disposed on the rear end 118 of the front shell 110 (FIG. 11). In such a case, the one principal surface 204 of the circuit board 200 is fixed on the principal surface 121a of the lower shell 120 via the fixation material 400, and the circuit board 200 is thermally conductably connected to the lower shell 120, thereby resulting in a state as illustrated in FIG. 10B.

The operator applies the heat transfer material 410 to a region other than a portion to which the connection 302 of the principal surface 211 of the semiconductor element 210 illustrated in FIG. 7 is connected.

Figure 12A:
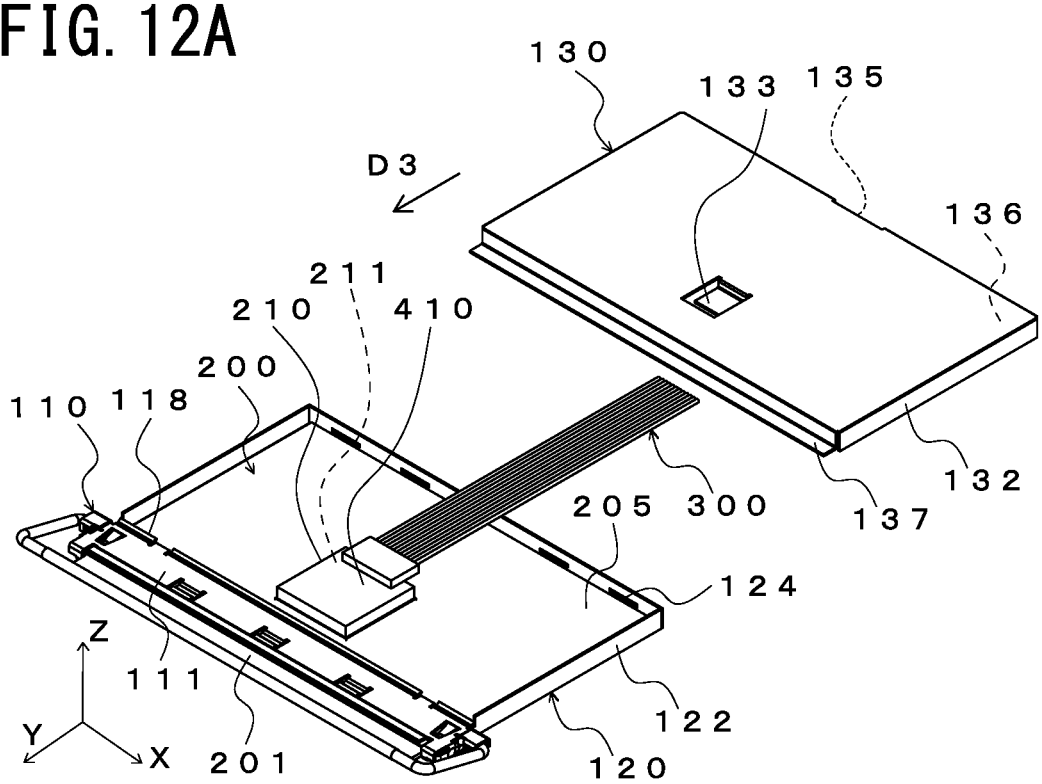
FIG. 12A is a perspective view of a state before the upper shell is engaged with the front shell.
Figure 12B:
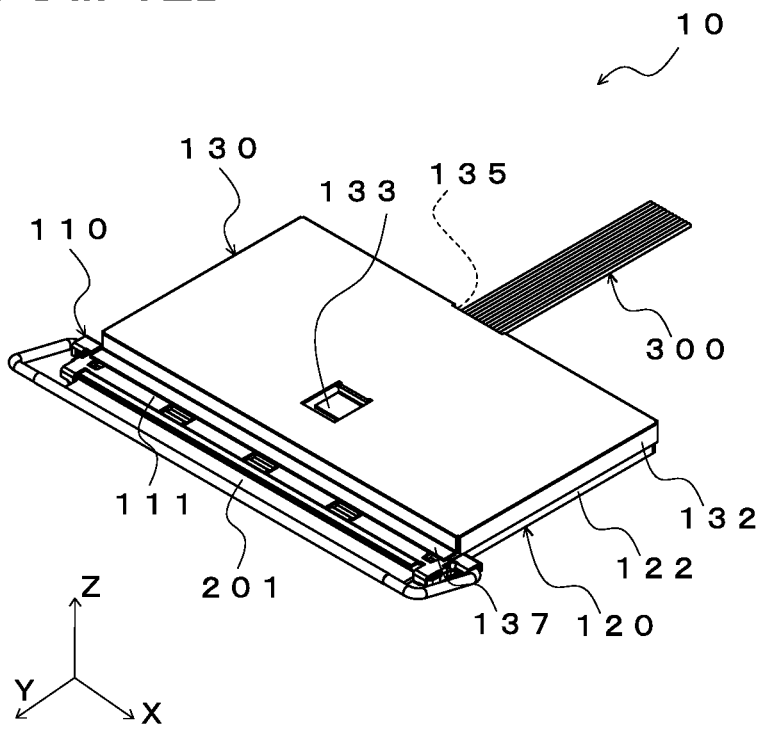
FIG. 12B is a perspective view of a state after the upper shell is engaged with the front shell.

As illustrated in FIG. 12A, the operator slides the upper shell 130 in the D3 direction along the other principal surface 205 of the circuit board 200. The abutment 137 of the upper shell 130 abuts on the rear end 118 of the body 111 of the front shell 110. Moreover, the engagers 136 are engaged with the engagement holes 124 of the lower shell 120. The risers 132 of the upper shell 130 are mated with the risers 122 of the lower shell 120, and the mated portions and the body 111, and the abutment 137 of the upper shell 130 are soldered to each other, thereby resulting in a state illustrated in FIG. 12B, to accomplish the connector 10.

The connector 10 of the present embodiment eliminates the need of a spacer for suppressing the unsteadiness of the circuit board 200 because the circuit board 200 is fixed on the lower shell 120 with the fixation material 400 having thermal conductivity. Accordingly, the connector 10 can be downsized. Moreover, the need for the lower shell 120 to include a heat sink for promoting dissipation of heat from the circuit board 200 is reduced. In addition, the connector 10 can be downsized in a case in which there is no need for a heat sink. In addition, the front end 117 of the body 111 of the front shell 110, in place of the circuit board 200, is mated with the mating connector 20, and therefore, strength required in the circuit board 200 is decreased. Accordingly, the circuit board 200 can be thinned, and the connector 10 can be downsized.

In the connector 10 of the present embodiment, the semiconductor element 210 is thermally conductably connected to the tongue 133 of the upper shell 130 via the heat transfer material 410. Therefore, heat generated by the semiconductor element 210 is diffused across the upper shell 130 through the tongue 133, and heat dissipation is promoted. Accordingly, the need for the upper shell 130 to include a heat sink is reduced. In addition, the connector 10 can be further downsized in a case in which there is no need for a heat sink.

In the connector 10 of the present embodiment, the semiconductor element 210 is thermally conductably connected to the circuit board 200 via the heat transfer material 420. Therefore, heat generated by the semiconductor element 210 is diffused to the lower shell 120 through the circuit board 200, and heat dissipation is promoted. Accordingly, the need for the housing 100 to include a heat sink is reduced. In addition, the connector 10 can be further downsized in a case in which there is no need for a heat sink.

In the connector 10 of the present embodiment, the semiconductor element 210 includes a silicon photonics circuit. In the silicon photonics circuit, components such as the LD, the PD, and the driver are integrated, and therefore, the connector 10 can be downsized.

In the connector 10 of the present embodiment, the signal wire 300 includes the optical fiber 301, and the optical fiber 301 is connected to the light emitting element 212 or the light receiving element 213 included in the semiconductor element 210. As a result, the silicon photonics circuit can be used in the semiconductor element 210, and the connector 10 can be further downsized.

In the connector 10 of the present embodiment, the lower shell 120 includes the engagers 123 in the front end 117, and the front shell 110 includes, in the rear end 118, the portions to be engaged 112 that are engaged with the engagers 123. Accordingly, the lower shell 120 can be tightly fixed on the front shell 110 by being fixed on the circuit board 200 and by being locked on the front shell 110. Thus, the connector 10 can be downsized, and the strength of the housing 100 of the connector 10 can be improved.

In the connector 10 of the present embodiment, the front shell 110 includes: the engagement claws 113 that are engaged with the circuit board 200; and the pressers 114 that press the other principal surface 205 of the circuit board 200. Thus, the circuit board 200 is prevented from falling out of the front shell 110, and the other principal surface 205 is pressed by the front shell 110. Therefore, it is not necessary to fix, on the circuit board 200, the upper shell 130 that is connected to the front shell 110 and engaged with the lower shell 120. Accordingly, a space for fixing the upper shell 130 and the circuit board 200 is not needed in the connector 10, and therefore, the connector 10 can be further downsized. Moreover, the circuit board 200 is more reliably fixed on the front shell 110.

In the connector 10 of the present embodiment, the insertion opening 135 into which the signal wire 300 is inserted is formed in the upper shell 130. Accordingly, the connector 10 can be further downsized because it is not necessary to dispose a gap for passing the signal wire 300 to the outside between the front shell 110, the lower shell 120, and the upper shell 130, and the housing 100 can be downsized.

Embodiment 2

Figure 17:
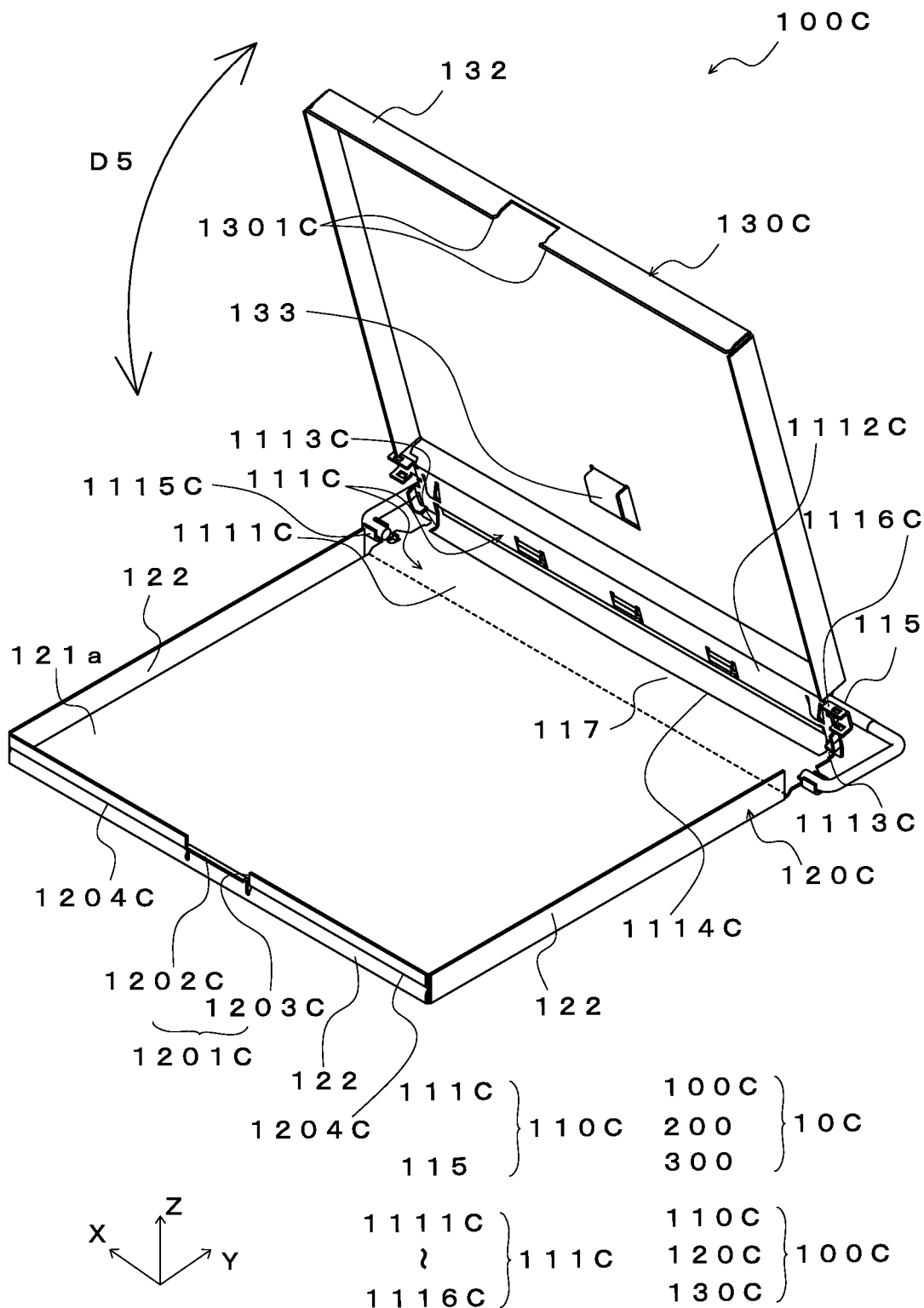
FIG. 17 is a perspective view of a state in which the housing of a connector according to Embodiment 2 of the present disclosure is opened.

As illustrated in FIG. 17, the housing 100C of a connector 10C according to Embodiment 2 differs from that of Embodiment 1 in that: a front shell 110C rotatably opens and closes in the D5 direction; a lower shell 120C is formed integrally with the front shell 110C in the +X-side; an upper shell 130C is formed integrally with the front shell 110C in the −X-side; and a locker 1301C is formed on the upper shell 130C, and a portion to be locked 1204C is formed on the lower shell 120C. In other words, the housing 100C is one component in the present embodiment. In a case in which no description is provided for a certain respect, the same as that of Embodiment 1 applies.

In the front shell 110C, a body 111C opens and closes about the X-axis between connections 1113C at both X-axis-direction ends of a front end (one end) 117. The body 111C includes an opposite 1111C, a cover 1112C, and the connections 1113C.

Figure 18A:
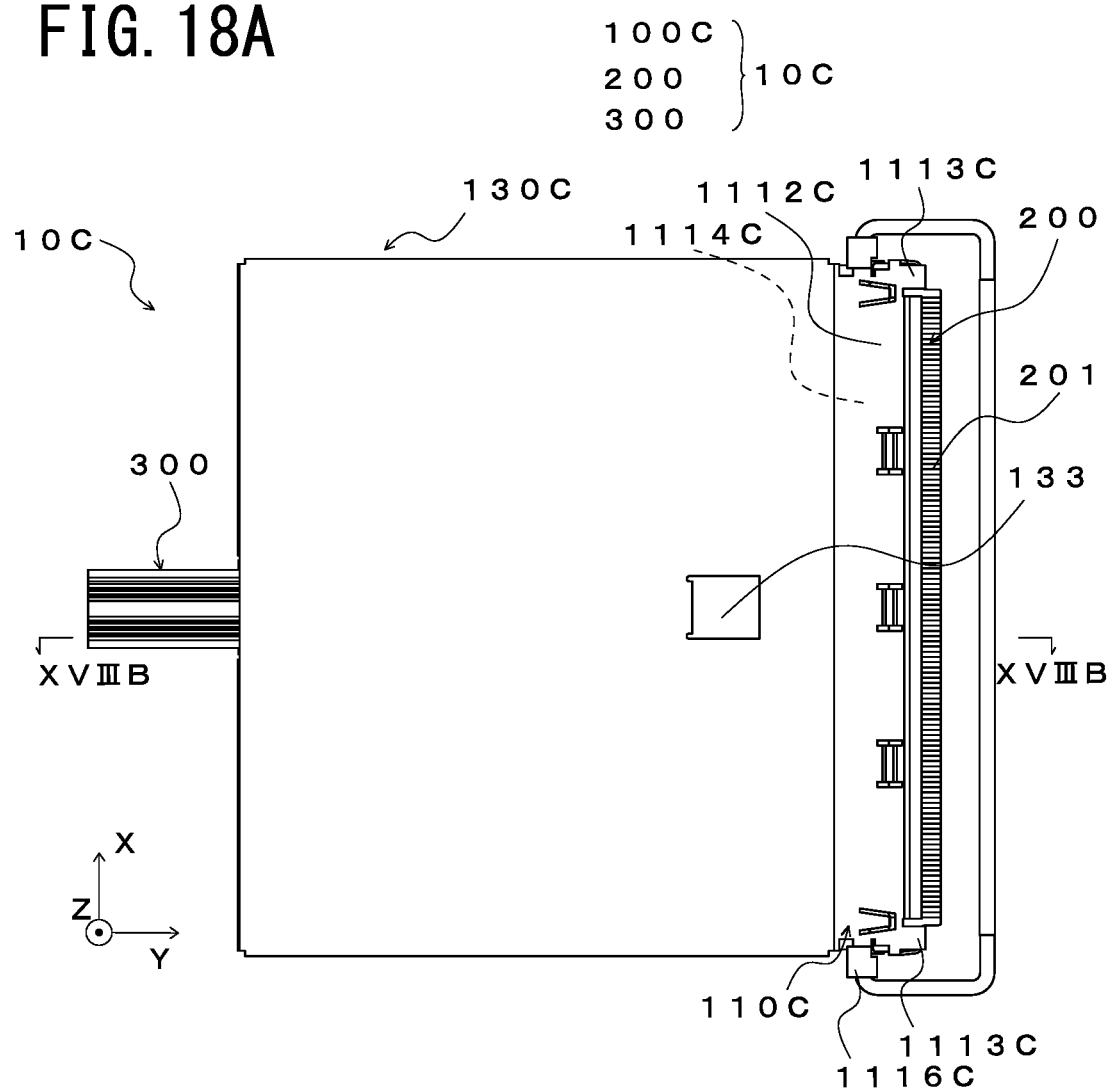
FIG. 18A is a plan view of the connector according to Embodiment 2 of the present disclosure.
Figure 18B:
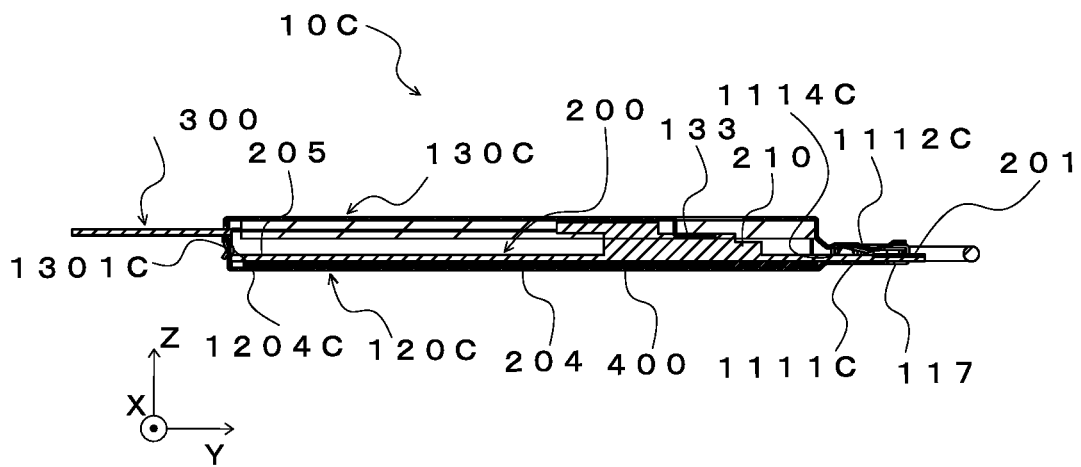
FIG. 18B is a cross-sectional view taken along the line XVIIIB-XVIIIB of FIG. 18A.

As illustrated in a cross-sectional view in FIG. 18B, the opposite 1111C is arranged to be opposed to one principal surface 204 of a circuit board 200. The opposite 1111C is formed integrally with the lower shell 120C. As illustrated in FIG. 17, the cover 1112C is connected to the opposite 1111C by the connections 1113C disposed on both the X-axis-direction ends of the front end 117 of the body 111C, to form the opposite 1111C, the connections 1113C, and an insertion portion 1114C. The cover 1112C is formed integrally with the upper shell 130C. The cover 1112C is opposed to the other principal surface 205 of the circuit board 200. Bending or stretching of the connections 1113C results in opening or closing of the front shell 110C. As illustrated in a plan view in FIG. 18A and the cross-sectional view in FIG. 18B, the terminal end portion 201 of the circuit board 200 is inserted into the insertion portion 1114C.

As illustrated in FIG. 17, a generally U-shaped mater 1115C formed on both the X-axis-direction ends of the opposite 1111C is mated with the generally U-shaped portion to be mated 1116C of the cover 1112C, whereby the front shell 110C becomes in a closed state. In the inside of the mater 1115C, both ends of a latch 115 are engaged, and the mater 1115C is mated with the portion to be mated 1116C, whereby the latch 115 is rotatably attached to the body 111C.

The lower shell 120C differs from the lower shell 120 of Embodiment 1 in that: the lower shell 120C includes none of the engagers 123, the engagement holes 124, the protrusions 125, and the soldering portion 126; and the lower shell 120C includes a signal wire insertion portion 1201C into which a signal wire 300 is inserted. The signal wire insertion portion 1201C includes: a signal wire abutment 1202C that abuts on the signal wire 300; and a signal wire insertion hole 1203C into which the signal wire 300 is inserted. Moreover, the lower shell 120C includes portions to be locked 1204C in a riser 122 in a −Y-direction end. The portions to be locked 1204C protrude in a slightly projection shape in the +Y-direction. Lockers 1301C described below are locked on the projections of the portions to be locked 1204C.

The upper shell 130C differs from the upper shell 130 of Embodiment 1 in that the upper shell 130C includes neither the engagers 136 nor the recesses 138. The upper shell 130C also differs from the upper shell 130 in that the upper shell 130C includes the lockers 1301C that are locked on the portions to be locked 1204C. The lockers 1301C are formed in a riser 132 in a −Y-direction end to slightly protrude in the +Y-direction. The projections of locker 1301C are locked over the protuberances of the portions to be locked 1204C.

(Method of Manufacturing Connector 10C)

Figure 19A:
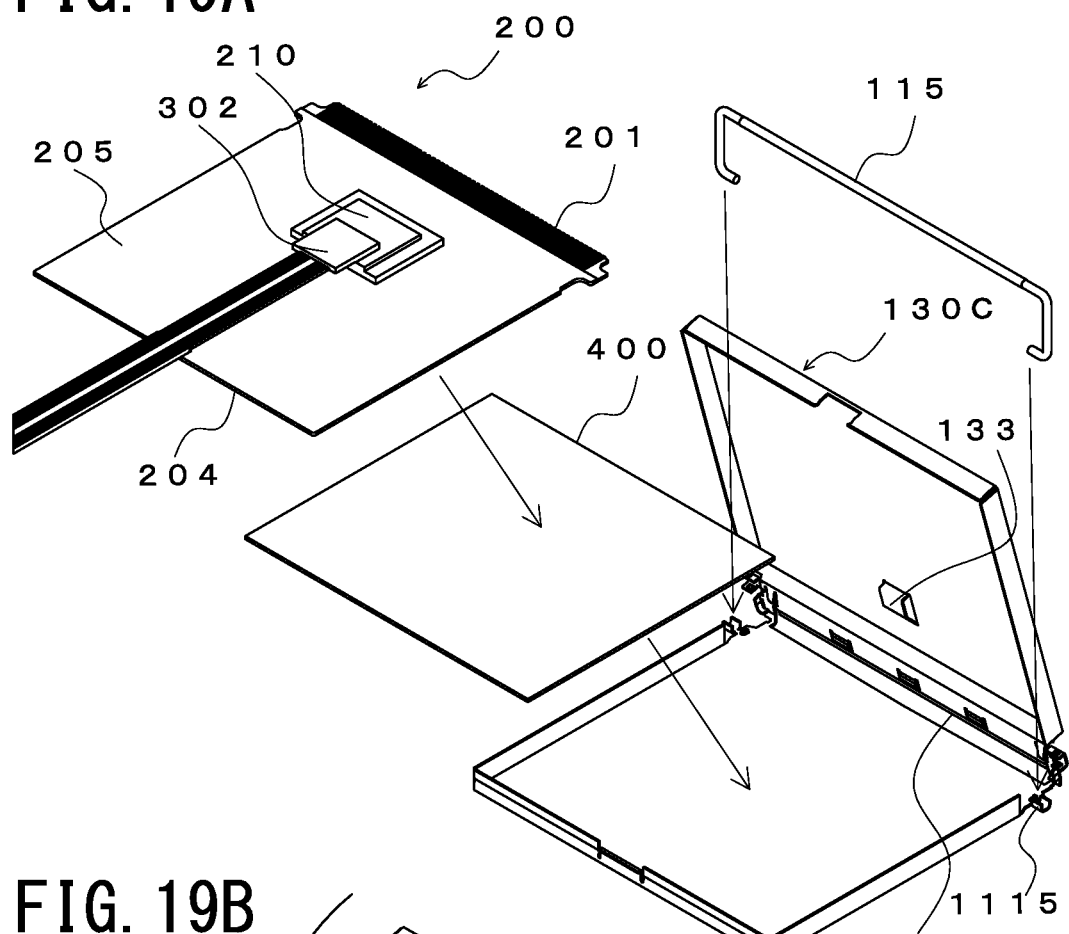
FIG. 19A is a perspective view in a case in which a circuit board is placed in a housing.
Figure 19B:
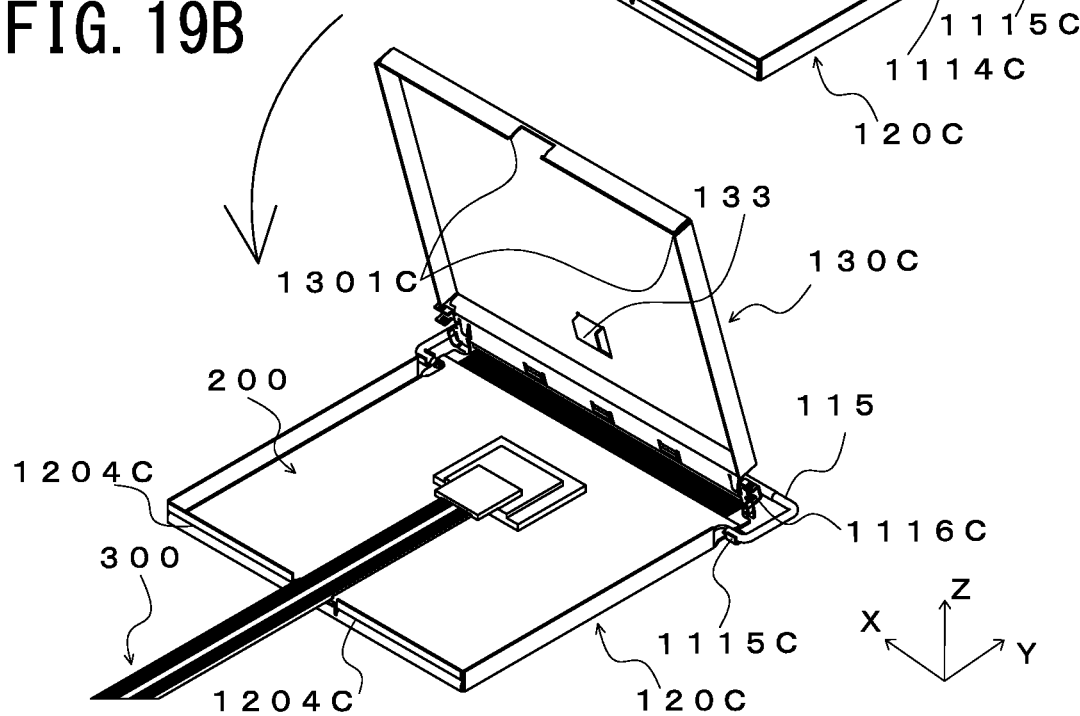
FIG. 19B is a perspective view in a case in which an upper shell is mated with a lower shell.

First, an operator inserts the terminal end portion 201 of the circuit board 200 into the insertion portion 1114C in a state in which the upper shell 130C is opened from the lower shell 120C, and places the circuit board 200 on the lower shell 120C via a fixation material 400 (or a heat transfer material) while allowing the terminal end portion 201 to protrude, as illustrated in FIG. 19A. Then, the upper shell 130C is mated with the lower shell 120C, and the mater 1115C with which the latch 115 is engaged is mated with the portion to be mated 1116C, as illustrated in FIG. 19B. The lockers 1301C are locked on the portions to be locked 1204C, to accomplish the connector 10C.

In the connector 10C of the present embodiment, the housing 100C of the connector 10C is one component, and therefore, the connector 10C can be more easily manufactured, and can be allowed to be smaller than the connector 10 of Embodiment 1, in which the front shell 110, the lower shell 120, and the upper shell 130, which are three components, are assembled.

Embodiment 3

As illustrated in an exploded perspective view in FIG. 20, the housing 100D of a connector 10D according to Embodiment 3 differs from that of Embodiment 2 in that: a front shell 110D can be separated into two portions; a heat exchanger plate 430 is disposed instead of the tongue 133; and locking pawls 1201D are disposed on a lower shell 120D. For the other respects, the same as that of Embodiment 2 applies. In other words, the housing 100D can be separated into two components in the present embodiment.

The front shell 110D includes a body 111D and a latch 115. The body 111D includes: a lower body 1111D included in the lower portion of the body 111D; and an upper body 1112D included in the upper portion of the body 111D. The connections 1113C on both the X-axis-direction ends of the front end (one end) 117 of Embodiment 2 are divided into the lower connections 1114D of the lower body 1111D and the upper connections 1116D of the upper body 1112D in the present embodiment.

The lower body 1111D includes: an opposite 1113D that is opposed to a circuit board 200; and the lower connections 1114D that is connected to the upper body 1112D. The opposite 1113D is opposed to one principal surface 204 of the circuit board 200, and is connected to the lower shell 120D. The lower connections 1114D are formed on both the X-axis-direction ends of the front end (one end) 117 of the lower body 1111D, and are connected to the upper connections 1116D, described below, of the upper body 1112D. Like the body 111C, the lower body 1111D includes U-shaped maters 1115C, and both ends of the latch 115 are engaged with the maters 1115C.

The upper body 1112D includes: a cover 1115D that is opposed to the other principal surface 205 of the circuit board 200; and the upper connections 1116D that are connected to the lower body 1111D. The cover 1115D is connected to the opposite 1113D via the upper connections 1116D and the lower connections 1114D, and forms an insertion portion together with the opposite 1113D, the upper connections 1116D, and the lower connections 1114D. The cover 1115D is connected to an upper shell 130D. Like the body 111C, the upper body 1112D includes U-shaped portions to be mated 1116C. The maters 1115C are mated with the portions to be mated 1116C, and the latch 115 is rotatably attached to the body 111D.

The lower shell 120D is formed integrally with the lower body 1111D, and is mated with the upper shell 130. The locking pawls 1201D are disposed on the +Y-direction ends of the risers 122 of the lower shell 120D. The locking pawls 1201D are locked on the +Y-direction ends of the portions to be mated 1116C of the upper shell 130D to suppress movement of the upper shell 130D in the +Y-direction. The upper shell 130D is formed integrally with the upper body 1112D. A tongue is not formed on the upper shell 130D, but the heat exchanger plate 430 is disposed, in place of the tongue, between the upper shell 130D and the circuit board 200. For example, a phase change material (PCM) is used in the heat exchanger plate 430 in the present embodiment.

(Method of Manufacturing Connector 10D)

First, an operator places the circuit board 200 on the lower shell 120D via a heat transfer material (not illustrated) while allowing the terminal end portion 201 of the circuit board 200 to protrude from the front end (one end) 117 of the lower body 1111D to the lower body 1111D and the lower shell 120D. Then, the upper shell 130D is mated with the lower shell 120D, and the maters 1115C with which the latch 115 is engaged are mated with the portions to be mated 1116C, to accomplish the connector 10D.

In the connector 10D of the present embodiment, the housing 100D of the connector 10D is assembled by mating two components, and therefore, the connector 10D can be more easily manufactured, and can be allowed to be smaller than the connector 10 of Embodiment 1, in which the front shell 110, the lower shell 120, and the upper shell 130, which are three components, are assembled.

Embodiment 4

Figure 21A:
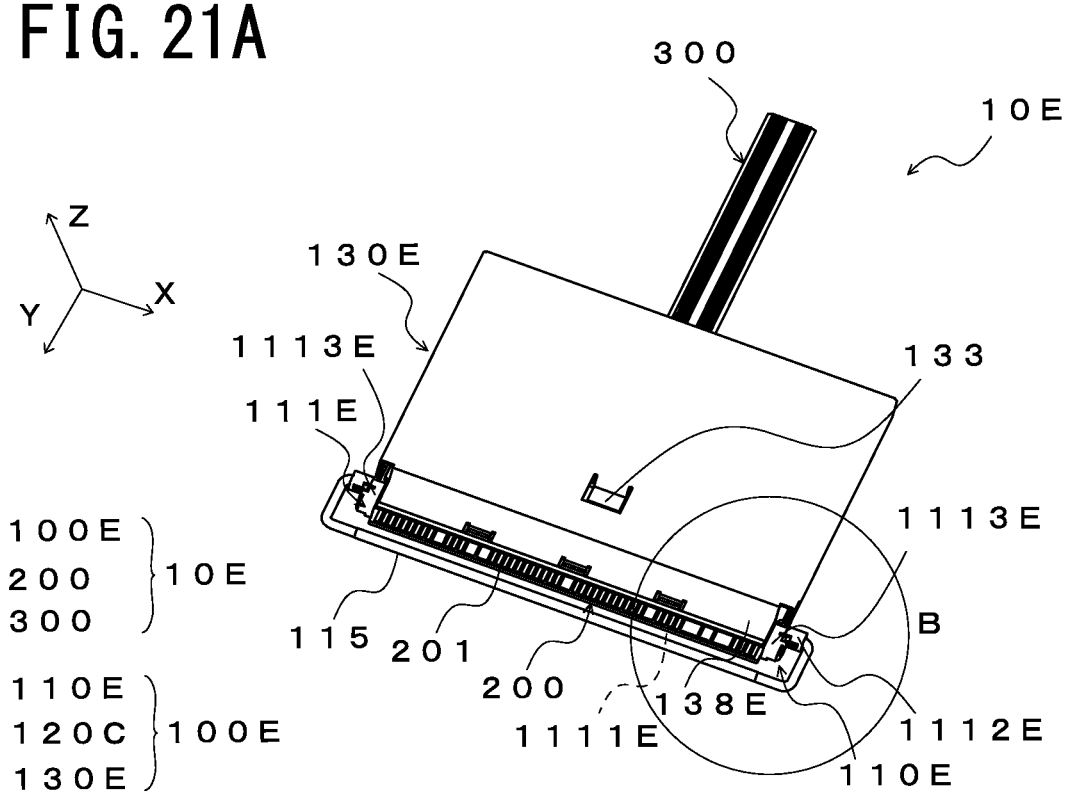
FIG. 21A is a perspective view of a connector according to Embodiment 4 of the present disclosure.
Figure 21B:
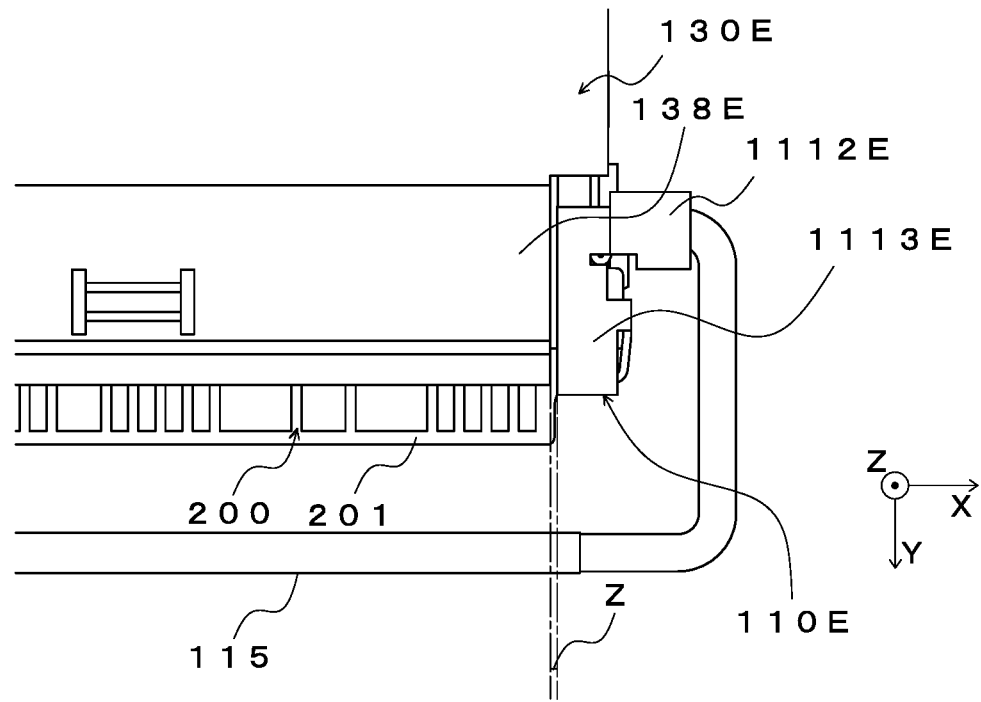
FIG. 21B is an enlarged plan view of a portion B of FIG. 21A.
Figure 22:
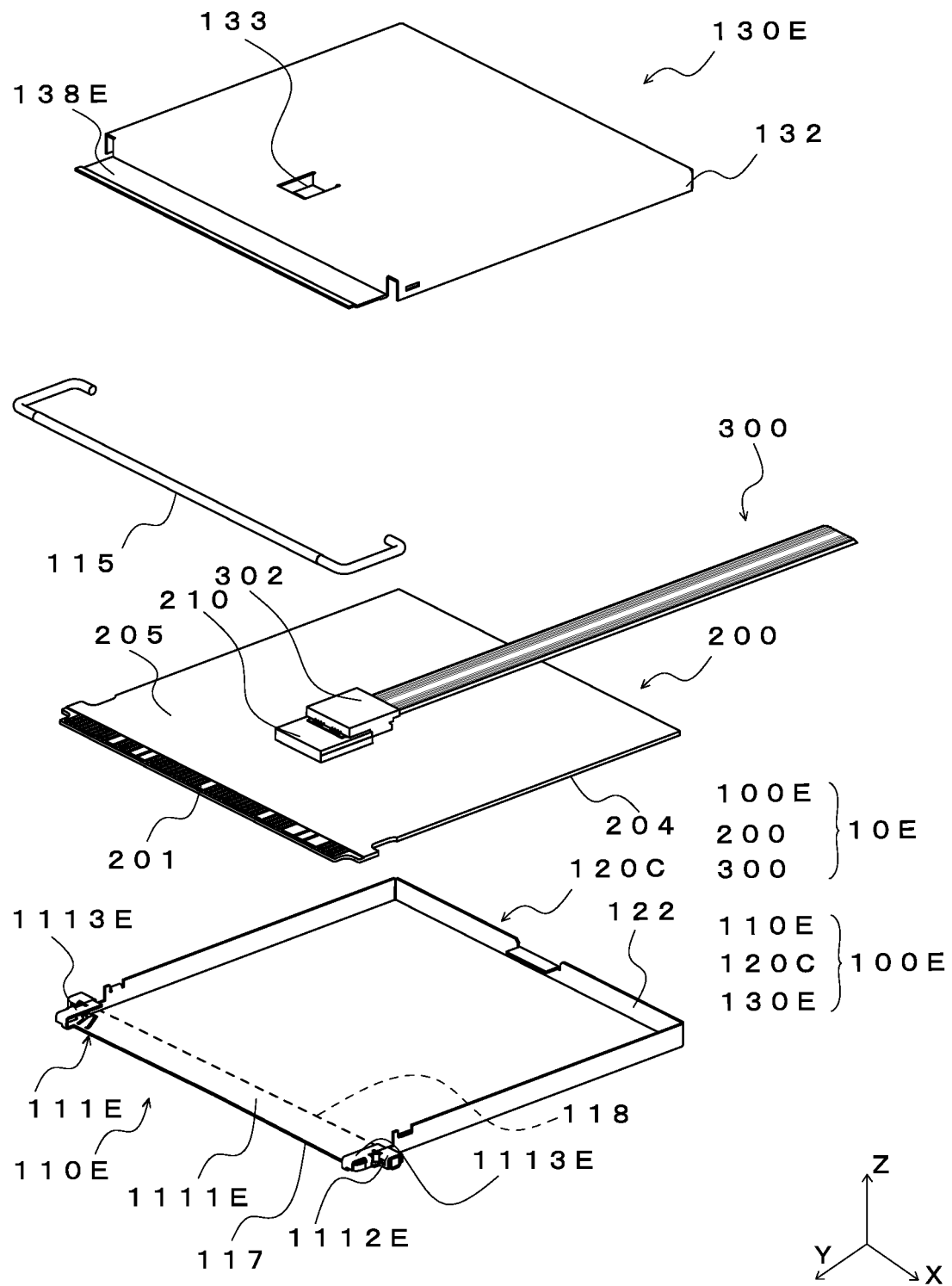
FIG. 22 is an exploded perspective view of the connector according to Embodiment 4 of the present disclosure.

As illustrated in FIGS. 21A, 21B, and 22, the housing 100E of a connector 10E according to Embodiment 4 differs from the housing 100D of Embodiment 3 in that: a front shell 110E does not include the upper body 1112D of Embodiment 3; and an upper shell 130E includes a portion corresponding to the cover 1115D of Embodiment 3. In other words, in the present embodiment, the housing 100E can be separated into two components, like the housing 100D of Embodiment 3. The housing 100E includes: the front shell 110E that is opposed to a circuit board 200, and allows a terminal end portion 201 to protrude; a lower shell 120C that is formed integrally with the front shell 110E, and covers one principal surface of the circuit board 200; and the upper shell 130E that covers the other principal surface of the circuit board 200, and is mated with the lower shell 120C.

As illustrated in FIG. 22, the front shell 110E includes a body 111E (corresponding to the lower body 1111D of Embodiment 3) and a latch 115. The body (lower body) 111E includes: an opposite 1111E that is opposed to one principal surface of the circuit board 200; a supporter 1112E having a generally cylindrical shape, which rotatably surrounds and supports both ends of the latch 115; and guides 1113E formed on both ends in the X-axis-direction. The guides 1113E is disposed for location in the X-axis-direction in the vicinity of the terminal end portion 201 of the circuit board 200. The body 111E does not include portions corresponding to the lower connections 1114D according to Embodiment 3.

The lower shell 120C is formed integrally with the body 111E, and is mated with the upper shell 130E. The lower shell 120C and the body 111E may be separate from each other.

The upper shell 130E differs from the upper shell 130D in that the upper shell 130E includes a cover 138E corresponding to the cover 1115D of the front shell 110D of Embodiment 3. Moreover, the upper shell 130E does not include the portions to be mated 1116C according to Embodiment 3. For the other respects, the upper shell 130E is similar to the upper shell 130D. As illustrated in FIG. 21B, both the X-axis-direction ends of the cover 138E are arranged at a spacing Z in a direction along a front end 117 (rear end 118 or X-axis-direction) from the guides 1113E formed on both the X-axis-direction ends of the front shell 110E, and are opposed to the guides 1113E, and any insertion portion is not formed. The cover 138E forms, together with the opposite 1111E and the guides 1113E, a space (corresponding to the insertion portion 1114C according to Embodiment 2), and the terminal end portion 201 of the circuit board 200 is arranged in the space described above.

(Method of Manufacturing Connector 10E)

First, an operator engages both ends of the latch 115 with the supporter 1112E of the front shell 110E. Then, the circuit board 200 is placed on the lower shell 120C via a heat transfer material (not illustrated) while allowing the terminal end portion 201 of the circuit board 200 to protrude from the front end 117 of the front shell 110E. Then, the upper shell 130E is mated with the lower shell 120C, and a mater 1115C with which the latch 115 is engaged is mated with a portion to be mated 1116C, to accomplish the connector 10E.

In the connector 10E of the present embodiment, the housing 100E of the connector 10E is assembled by mating two components, and therefore, the connector 10E can be more easily manufactured, and can be allowed to be smaller than the connector 10 of Embodiment 1, in which the front shell 110, the lower shell 120, and the upper shell 130, which are three components, are assembled.

Each embodiment of the present disclosure has been described above. However, the present disclosure is not limited to the embodiments described above.

Alternative Example 1

In Embodiment 1 as described above, the circuit board 200 is fixed on the lower shell 120 with the fixation material 400 having thermal conductivity, as illustrated in FIG. 2B. However, a method of fixing the circuit board 200 is not limited thereto. Alternative Example 1 in which a method of fixing a circuit board 200 is different will be described below with reference to FIGS. 13A and 13B. In Alternative Example 1, the shape of a lower shell 120A is different from those in the embodiments described above. In Alternative Example 1 (and Alternative Example 2) below, description of configurations similar to those in the embodiments described above is omitted, and respects different from those in Embodiment 1 are primarily described.

Figure 13A:
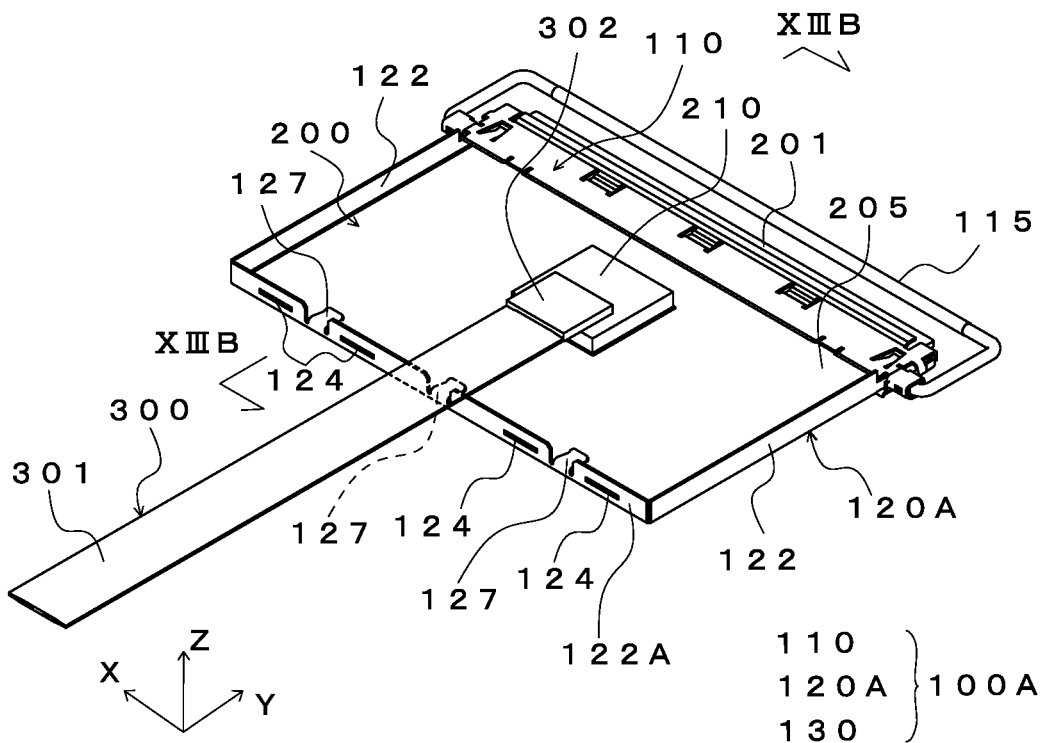
FIG. 13A is a perspective view of a lower shell, a front shell, and a circuit board according to Alternative Example 1 of the present disclosure.
Figure 13B:
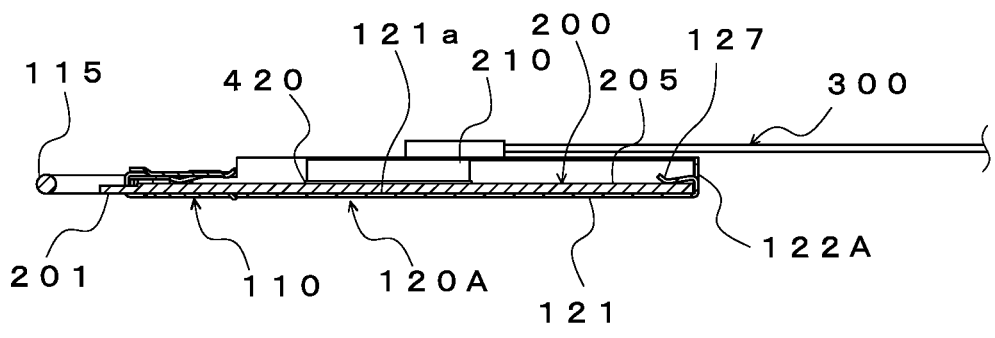
FIG. 13B is a cross-sectional view of the lower shell, the front shell, and the circuit board, taken along the line XIIIB-XIIIB in FIG. 13A.

As illustrated in FIGS. 13A and 13B, L-shaped constraint pawls 127 are formed at predetermined spacings by making incisions in parts of a riser 122A on the −Y-direction end of the lower shell 120A of the housing 100A of a connector 10A. The circuit board 200 is arranged on a principal surface 121a of the lower shell 120A, and the upper portions of the constraint pawls 127 are bent in the +Y-direction, whereby, with the constraint pawls 127, at least a part of a target region (a region other than a terminal end portion 201) of one principal surface 204 of the circuit board 200 is fixed to come into contact with the principal surface 121a of the lower shell 120A. Each constraint pawl 127 is an example of a fixation member. The fixation may also be performed by bending the constraint pawls 127 in advance, and by deforming the constraint pawls 127 by the circuit board 200 (increasing a distance between the constraint pawls 127 and the principal surface 121a of the lower shell 120A) when the lower shell 120A is locked on the front shell 110.

As described above, in Alternative Example 1, the circuit board 200 is fixed on the lower shell 120A with the constraint pawls 127, and therefore, the need for a spacer for suppressing the unsteadiness of the circuit board 200 is eliminated. Accordingly, the connector 10A can be downsized. In Alternative Example 1, at least a part of the target region (the region other than the terminal end portion 201) of the one principal surface 204 of the circuit board 200 is fixed to come into contact with the principal surface 121a of the lower shell 120A, with the constraint pawls 127, and therefore, heat from the circuit board 200 is dissipated to the outside through the lower shell 120A. Accordingly, the need for the lower shell 120A to include a heat sink for dissipating heat from the circuit board 200 is reduced, and the connector 10A can be downsized in a case in which there is no need for a heat sink. In Alternative Example 1, the fixation material 400 is not used between the lower shell 120A and the circuit board 200, and therefore, waiting time before the fixation material 400 is solidified is not necessary, whereby time for which the connector 10A is assembled can be shortened to be able to reduce a manufacturing cost.

Alternative Example 2

Alternative Example 2 of a method of fixing a circuit board 200, different from Embodiment 1 and Alternative Example 1 described above, will be described with reference to FIGS. 14A and 14B, FIGS. 15A and 15B, and FIGS. 16A and 16B. In Alternative Example 2, the shapes of a lower shell 120B and a circuit board 200A are different from those in the embodiments described above.

As illustrated in FIGS. 14A and 14B, in the lower shell 120B of the housing 100B of the connector 10B, insertion pawls 128 in a pair are formed by bending, in the +Z-direction (upward direction), tongue-shaped members formed by making generally lateral square-U-shaped incisions in a base 121B in the vicinity of risers 122 on ends in the −Y-direction (backward direction).

As illustrated in FIGS. 15A and 15B, the circuit board 200A includes insertion holes 206 in a pair at positions corresponding to the insertion pawls 128 in a pair of the lower shell 120B. As illustrated in FIGS. 16A and 16B, the insertion pawls 128 of the lower shell 120B are inserted into the insertion holes 206. After the insertion, the insertion pawls 128 are fixed on the circuit board 200A by solder so that at least a part of a target region (a region other than a terminal end portion 201) of one principal surface 204 of the circuit board 200A comes into contact with a principal surface 121a of the lower shell 120B. The solder by which the insertion pawls 128 are fixed on the circuit board 200A is an example of a fixation member.

As described above, in Alternative Example 2, the circuit board 200A is fixed on the lower shell 120B with the insertion pawls 128 and the solder, and therefore, the need for a spacer for suppressing the unsteadiness of the circuit board 200A is eliminated. Accordingly, the connector 10B can be downsized. In Alternative Example 2, at least a part of the target region (the region other than the terminal end portion 201) of the one principal surface 204 of the circuit board 200A is fixed to come into contact with the principal surface 121a of the lower shell 120B, and therefore, heat from the circuit board 200A is dissipated to the outside through the lower shell 120B. Accordingly, the need for the lower shell 120B to include a heat sink for dissipating heat from the circuit board 200A is reduced, and the connector 10B can be downsized in a case in which there is no need for a heat sink. In Alternative Example 2, the fixation material 400 is not used between the lower shell 120B and the circuit board 200A, and therefore, waiting time before the fixation material 400 is solidified is not necessary, whereby time for which the connector 10B is assembled can be shortened to be able to reduce a manufacturing cost.

Other Alternative Example

In each of the embodiments described above, an example in which the connector 10 is an AOC connector is described. However, the connector 10 may be an electric connector. The semiconductor element 210 may also be a common circuit that does not include a silicon photonics circuit. It is also acceptable that a signal wire does not include an optical fiber. A configuration in which a connector can be downsized is preferably acceptable.

In Embodiment 1 and Alternative Examples as described above, the housing 100 includes the front shell 110, the lower shell 120, and the upper shell 130 as separate members. However, the front shell 110 and the lower shell 120, or the front shell 110 and the upper shell 130 may be integrally formed. Since it is not necessary to dispose a connection portion between the integrally formed shells, a connector can be further downsized. Moreover, the number of steps of manufacturing the connector and the number of components can be reduced, and shortening of the manufacturing steps and a reduction in cost are thus enabled.

In the embodiments described above, examples in which the insertion opening 135 is disposed in the upper shell 130 are described. However, it is also acceptable that an insertion portion is disposed in a lower shell, and a circuit board is fixed on an upper shell via a fixation material.

In each of the embodiments described above, the reflecting mirror 303 is arranged on the connection 302. However, it is also acceptable that a connection is connected from the rear to a semiconductor element, and a reflecting mirror is arranged on the semiconductor element.

In each of the embodiments described above, the lower shell 120 and the upper shell 130 are mated with each other. However, it is also acceptable that ends of a lower shell and an upper shell are thrust onto each other, and are fixed to each other by soldering.

In Alternative Example 1 or 2, the fixation members for fixing at least a part of the target region (the region other than the terminal end portion 201) of the one principal surface 204 of the circuit board 200 or 200A to come into contact with the principal surface 121a of the lower shell 120A or 120B is the constraint pawls 127, or the insertion pawls 128 and solder. However, the fixation may be performed with another fixation member as long as at least a part of the target region of the one principal surface 204 of the circuit board can be fixed to come into contact with the principal surface 121a of the lower shell. For example, it is also acceptable that the pressers 114 of the front shell 110 are used as fixation members, and the circuit board 200 is fixed on the lower shell 120 by the force of the pressers 114. Alternatively, it is also acceptable that, for example, a press that presses the circuit board 200 against the lower shell 120 and fixes the circuit board 200 on the lower shell 120 is used as a fixation member, the press is disposed on the upper shell.

In Embodiment 1, 2, and 4 as described above, the tongue 133 is formed on the upper shell 130 or 130C. However, it is also acceptable that a heat radiating plate (heat exchanger plate) is arranged between the upper shell 130, 130C, or 130D, and the semiconductor element 210 of the circuit board 200.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

This application claims the benefit of Japanese Patent Application No. 2019-71593, filed on Apr. 3, 2019, the entire disclosure of which is incorporated by reference herein.

| Reference Signs List | |
|---|---|
| 1 | Connector unit |
| 10, 10A, 10B, 10C, 10D, 10E | Connector |
| 20 | Mating connector |
| 21 | Wall surface |
| 100, 100A, 100B, 100C, 100D, 100E | Housing |
| 110, 110C, 110D, 110E | First shell (front shell) |
| 120, 120A, 120B, 120C, 120D | Second shell (lower shell) |
| 130, 130C, 130D, 130E | Third shell (upper shell) |
| 111, 111C, 111D, 111E | Body |
| 111a, 1114C | Insertion portion, |
| 111b, 111A, 1111C, 1113D, 1111E | Opposite |
| 111c, 111B, 1112C, 1115D, 138E | Cover |
| 111d, 1113C | Connection |
| 112 | Portion to be engaged |
| 113 | Engagement claw |
| 114 | Presser |
| 115 | Latch |
| 116a | Soldering portion |
| 116b | Abutment |
| 117 | One end (front end) |
| 118 | Other end (rear end) |

| Reference Signs List | |
|---|---|
| 119 | Recess |
| 121, 121B | Base |
| 121a | Principal surface |
| 122, 122A | Riser |
| 123 | Engager |
| 124 | Engagement hole |
| 125 | Protrusion |
| 126 | Soldering portion |
| 127 | Constraint pawl |
| 128 | Insertion pawl |
| 131 | Base |
| 132 | Riser |
| 133 | Tongue |
| 134 | Gap |
| 135 | Insertion opening |
| 136 | Engager |
| 137 | Abutment |
| 138 | Recess |
| 200, 200A | Circuit board |
| 201 | Terminal end portion |
| 202 | Projection |
| 203 | Connection terminal |
| 204 | One principal surface |
| 205 | Other principal surface |
| 206 | Insertion hole |
| 210 | Semiconductor element |
| 211 | Principal surface |
| 212 | Light emitting element |
| 213 | Light receiving element |
| 300 | Signal wire |
| 301 | Optical fiber |
| 302 | Connection |
| 303 | Reflecting mirror |
| 400 | First heat transfer material (fixation material) |
| 410 | Second heat transfer material (heat transfer material) |
| 420 | Third heat transfer material (heat transfer material) |
| 430 | Heat exchanger plate |
| 1111D | Lower body |
| 1112D | Upper body |
| 1112E | Supporter |
| 1113E | Guide |
| 1114D | Lower connection |
| 1115C | Mater |
| 1116C | Portion to be mated |
| 1116D | Upper connection |
| 1201C | Signal wire insertion portion |
| 1201D | Locking pawl |
| 1202C | Signal wire abutment |
| 1203C | Signal wire insertion hole |
| 1204C | Portion to be locked |
| 1301C | Locker |

The invention claimed is:

1. A connector comprising:

a circuit board that is connected to an outside via a signal wire;

a first heat transfer material that is arranged on one principal surface of the circuit board;

a first shell of which one end is mated with a mating connector in a state in which a terminal end portion of the circuit board protrudes from the one end, and which comprises an opposite opposed to at least a part of a target region which is a region other than the terminal end portion of the circuit board, covers at least a part of the target region, and is conductive;

a second shell that is connected to another end of the first shell, covers at least a part of the target region in the one principal surface of the circuit board, is thermally conductably connected to the circuit board in contact with the first heat transfer material, and is conductive; and a third shell that is engaged with the second shell, covers at least a part of the target region in another principal surface of the circuit board, and is conductive,
wherein the first shell, the second shell, and the third shell cover the target region of the circuit board, and
the first shell further includes opposing side ends with which opposing end portions of a latch are rotatably engaged, the latch having a C-shape and being fixable to the mating connector.

2. The connector according to claim 1, wherein the third shell is spaced from the first shell in a direction along the one end, or in a direction along a thickness direction of the circuit board, and opposed to the target region of the circuit board.

3. The connector according to claim 1, wherein the first shell comprises a cover that is connected to the opposite, and forms, together with the opposite, an insertion portion, and the terminal end portion of the circuit board is inserted into the insertion portion.

4. The connector according to claim 1, wherein the first shell is formed integrally with the second shell.

5. The connector according to claim 4, wherein the first shell is further formed integrally with the third shell, the first shell formed integrally with the second shell, and the first shell formed integrally with the third shell to rotatably open and close.

6. The connector according to claim 1, wherein a heat generation member is arranged on the other principal surface of the circuit board, and
a part of the third shell is thermally conductably connected to the heat generation member via a second heat transfer material.

7. The connector according to claim 6, wherein a tongue is formed in the third shell, and the tongue is bent in contact with the second heat transfer material.

8. The connector according to claim 6, wherein the heat generation member is thermally conductably connected to the circuit board via a third heat transfer material.

9. The connector according to claim 6, wherein the heat generation member comprises a semiconductor element comprising a silicon photonics circuit.

10. The connector according to claim 9, wherein the signal wire comprises an optical fiber, the optical fiber is connected to a light emitting element or light receiving element included in the semiconductor element, and an electric terminal of the semiconductor element is connected to a plurality of connection terminals arranged on the terminal end portion via a wiring line formed on the circuit board.

11. The connector according to claim 1, wherein the second shell or the third shell comprises an engager arranged on one end thereof, and the first shell comprises a portion to be engaged, which is arranged on the other end, and is engaged with the engager.

12. The connector according to claim 1, wherein the first shell comprises:
an engagement claw that is engaged with the circuit board; and
a presser that presses the other principal surface of the circuit board.

13. The connector according to claim 1, wherein an insertion opening into which the signal wire is inserted is opened in at least one of the second shell and the third shell.

14. The connector according to claim 1, wherein the first heat transfer material is a fixation material with which the one principal surface of the circuit board is fixed on the principal surface of the second shell.

15. A connector comprising:
a circuit board that is connected to an outside via a signal wire;
a fixation member with which fixation of the circuit board is performed;
a first shell of which one end is mated with a mating connector in a state in which a terminal end portion of the circuit board protrudes from the one end, and which covers at least a part of a target region which is a region other than the terminal end portion of the circuit board, and is conductive;
a second shell that is connected to another end of the first shell, covers at least a part of the target region in one principal surface of the circuit board, and is conductive; and
a third shell that is connected to the other end of the first shell, is engaged with the second shell, covers at least a part of the target region in another principal surface of the circuit board, and is conductive, wherein
the first shell, the second shell, and the third shell cover the target region of the circuit board,
the fixation is performed with the fixation member so that at least a part of the target region in the one principal surface of the circuit board comes into contact with a principal surface of the second shell, and
the first shell further includes opposing side ends with which opposing end portions of a latch are rotatably engaged, the latch having a C-shape and being fixable to the mating connector.

16. A connector comprising:
a circuit board that is connected to an outside via a signal wire;
a thermally-conductive fixation material that is arranged on one principal surface of the circuit board;
a first shell in which an insertion portion into which a terminal end portion of the circuit board is inserted is formed on one end, of which the one end is mated with a mating connector in a state in which the terminal end portion of the circuit board protrudes from the one end, and which covers at least a part of a target region which is a region other than the terminal end portion of the circuit board, and is conductive;
a second shell that is connected to another end of the first shell, covers at least a part of the target region in the one principal surface of the circuit board, comes into contact with the fixation material to perform fixation of the circuit board, and is conductive; and
a third shell that is connected to the other end of the first shell, is engaged with the second shell, covers at least a part of the target region in another principal surface of the circuit board, and is conductive, wherein
the first shell, the second shell, and the third shell cover the target region of the circuit board, and
the first shell further includes opposing side ends with which opposing end portions of a latch are rotatably engaged, the latch having a C-shape and being fixable to the mating connector.

17. The connector according to claim 2, wherein the first shell is formed integrally with the second shell.

18. The connector according to claim 17, wherein the first shell is further formed integrally with the third shell.

19. The connector according to claim 3, wherein the first shell is formed integrally with the second shell.

20. The connector according to claim 19, wherein the first shell is further formed integrally with the third shell.

21. The connector according to claim 1, wherein the first heat transfer material is an adhesive.

\* \* \* \* \*